United States Patent
Morin et al.

(10) Patent No.: US 12,123,432 B2
(45) Date of Patent: Oct. 22, 2024

(54) LOW NOISE TURBINE FOR GEARED TURBOFAN ENGINE

(71) Applicants: RAYTHEON TECHNOLOGIES CORPORATION, Farmington, CT (US); MTU Aero Engines AG, Munich (DE)

(72) Inventors: Bruce L. Morin, Longmeadow, MA (US); Detlef Korte, Karlsfeld (DE)

(73) Assignees: RTX CORPORATION, Farmington, CT (US); MTU AERO ENGINES AG, Munich (DE)

( * ) Notice: Subject to any disclaimer, the term of this patent is extended or adjusted under 35 U.S.C. 154(b) by 0 days.

(21) Appl. No.: 18/201,875

(22) Filed: May 25, 2023

(65) Prior Publication Data

US 2023/0296114 A1    Sep. 21, 2023

Related U.S. Application Data

(63) Continuation of application No. 16/849,204, filed on Apr. 15, 2020, now abandoned, which is a
(Continued)

(51) Int. Cl.
*F02C 7/36* (2006.01)
*F01D 5/06* (2006.01)
(Continued)

(52) U.S. Cl.
CPC ............. *F04D 29/663* (2013.01); *F01D 5/06* (2013.01); *F01D 5/14* (2013.01); *F01D 15/12* (2013.01);
(Continued)

(58) Field of Classification Search
CPC .................................. F02C 7/36; F02C 3/107
See application file for complete search history.

(56) References Cited

U.S. PATENT DOCUMENTS 2,258,792 A    10/1941  New
2,850,226 A     9/1958  Lundquist
(Continued)

FOREIGN PATENT DOCUMENTS

CA    2736339 A1    10/2011
CA    2863620 A1     8/2013
(Continued)

OTHER PUBLICATIONS

Datasheet. CFM56-5B For the Airbus A320ceo family and CFM56-7B for the Boeing 737 family. https://www.cfmaeroengines.com/.
(Continued)

*Primary Examiner* — Gerald L Sung
(74) *Attorney, Agent, or Firm* — Carlson, Gaskey & Olds, P.C.

(57) ABSTRACT

An aircraft system includes, among other things, an aircraft and a gas turbine engine coupled to the aircraft. The gas turbine engine includes a propulsor section including a propulsor, a compressor section, a turbine section including a first turbine and a second turbine, and a gear reduction between the propulsor and the second turbine. The second turbine includes a number of turbine blades in each of a plurality of rows of the second turbine. The second turbine blades operating at least some of the time at a rotational speed. The number of blades and the rotational speed being such that the following formula holds true for a majority of the blade rows of the second turbine: 5500 Hz≤(number of blades×speed)/60 sec≤10000 Hz. The gas turbine engine is rated to produce 15,000 pounds of thrust or more.

20 Claims, 2 Drawing Sheets

Related U.S. Application Data continuation of application No. 15/245,383, filed on Aug. 24, 2016, now abandoned, which is a continuation of application No. 15/007,784, filed on Jan. 27, 2016, now abandoned, which is a continuation of application No. 14/996,544, filed on Jan. 15, 2016, now abandoned, which is a continuation-in-part of application No. 14/795,931, filed on Jul. 10, 2015, now abandoned, which is a continuation-in-part of application No. 14/248,386, filed on Apr. 9, 2014, now abandoned, which is a continuation-in-part of application No. PCT/US2013/020724, filed on Jan. 9, 2013.

(60) Provisional application No. 61/884,660, filed on Sep. 30, 2013, provisional application No. 61/592,643, filed on Jan. 31, 2012.

(51) Int. Cl.

| | | |
|---|---|---|
| *F01D 5/14* | (2006.01) | |
| *F01D 15/12* | (2006.01) | |
| *F01D 25/24* | (2006.01) | |
| *F02C 3/04* | (2006.01) | |
| *F02C 3/107* | (2006.01) | |
| *F02K 3/04* | (2006.01) | |
| *F02K 3/06* | (2006.01) | |
| *F04D 25/04* | (2006.01) | |
| *F04D 29/053* | (2006.01) | |
| *F04D 29/32* | (2006.01) | |
| *F04D 29/66* | (2006.01) | |
| *G06F 30/17* | (2020.01) | |

(52) U.S. Cl.
CPC ............ *F01D 25/24* (2013.01); *F02C 3/04* (2013.01); *F02C 3/107* (2013.01); *F02C 7/36* (2013.01); *F02K 3/04* (2013.01); *F02K 3/06* (2013.01); *F04D 25/045* (2013.01); *F04D 29/053* (2013.01); *F04D 29/321* (2013.01); *F04D 29/325* (2013.01); *G06F 30/17* (2020.01); *F05D 2220/323* (2013.01); *F05D 2230/50* (2013.01); *F05D 2260/40311* (2013.01); *F05D 2260/96* (2013.01); *F05D 2270/304* (2013.01); *F05D 2270/333* (2013.01)

(56) References Cited

U.S. PATENT DOCUMENTS

| | | |
|---|---|---|
| 2,936,655 A | 5/1960 | Peterson et al. |
| 2,957,655 A | 10/1960 | Knapp et al. |
| 3,021,731 A | 2/1962 | Stoeckicht |
| 3,194,487 A | 7/1965 | Tyler et al. |
| 3,270,953 A | 9/1966 | Jan et al. |
| 3,287,906 A | 11/1966 | McCormick |
| 3,352,178 A | 11/1967 | Lindgren et al. |
| 3,373,928 A | 3/1968 | Erwin et al. |
| 3,412,560 A | 11/1968 | Gaubatz |
| 3,448,582 A | 6/1969 | Bracey et al. |
| 3,618,699 A | 11/1971 | Evans et al. |
| 3,664,612 A | 5/1972 | Skidmore et al. |
| 3,747,343 A | 7/1973 | Rosen |
| 3,754,484 A | 8/1973 | Roberts |
| 3,765,623 A | 10/1973 | Donelson et al. |
| 3,820,719 A | 6/1974 | Clark et al. |
| 3,843,277 A | 10/1974 | Ehrich |
| 3,892,358 A | 7/1975 | Gisslen |
| 3,932,058 A | 1/1976 | Harner et al. |
| 3,935,558 A | 1/1976 | Miller et al. |
| 3,953,148 A | 4/1976 | Seippel et al. |
| 3,973,865 A | 8/1976 | Mugele |
| 3,988,889 A | 11/1976 | Chamay et al. |
| 4,130,872 A | 12/1978 | Haloff |
| 4,131,387 A | 12/1978 | Kazin et al. |
| 4,220,171 A | 9/1980 | Ruehr et al. |
| 4,240,250 A | 12/1980 | Harris |
| 4,284,174 A | 8/1981 | Salvana et al. |
| 4,289,360 A | 9/1981 | Zirin |
| 4,478,551 A | 10/1984 | Honeycutt, Jr. et al. |
| 4,649,114 A | 3/1987 | Miltenburger et al. |
| 4,696,156 A | 9/1987 | Burr et al. |
| 4,722,357 A | 2/1988 | Wynosky |
| 4,732,532 A | 3/1988 | Schwaller et al. |
| 4,782,658 A | 11/1988 | Perry |
| 4,883,240 A | 11/1989 | Adamson et al. |
| 4,968,216 A | 11/1990 | Anderson et al. |
| 4,979,362 A | 12/1990 | Vershure, Jr. |
| 5,058,617 A | 10/1991 | Stockman et al. |
| 5,079,916 A | 1/1992 | Johnson |
| 5,102,379 A | 4/1992 | Pagluica et al. |
| 5,141,182 A | 8/1992 | Coffinberry |
| 5,141,400 A | 8/1992 | Murphy et al. |
| 5,169,288 A | 12/1992 | Gliebe et al. |
| 5,190,441 A | 3/1993 | Murphy et al. |
| 5,197,855 A | 3/1993 | Magliozzi et al. |
| 5,317,877 A | 6/1994 | Stuart |
| 5,361,580 A | 11/1994 | Ciokajlo et al. |
| 5,433,674 A | 7/1995 | Sheridan et al. |
| 5,447,411 A | 9/1995 | Curley et al. |
| 5,466,198 A | 11/1995 | McKibbin et al. |
| 5,486,091 A | 1/1996 | Sharma |
| 5,524,847 A | 6/1996 | Brodell et al. |
| 5,634,767 A | 6/1997 | Dawson |
| 5,677,060 A | 10/1997 | Terentieva et al. |
| 5,778,659 A | 7/1998 | Duesler et al. |
| 5,857,836 A | 1/1999 | Stickler et al. |
| 5,915,917 A | 6/1999 | Eveker et al. |
| 5,975,841 A | 11/1999 | Lindemuth et al. |
| 5,985,470 A | 11/1999 | Spitsberg et al. |
| 6,036,438 A | 3/2000 | Imai |
| 6,195,983 B1 | 3/2001 | Wadia et al. |
| 6,223,616 B1 | 5/2001 | Sheridan |
| 6,260,794 B1 | 7/2001 | Rowe |
| 6,315,815 B1 | 11/2001 | Spadaccini et al. |
| 6,318,070 B1 | 11/2001 | Rey et al. |
| 6,387,456 B1 | 5/2002 | Eaton, Jr. et al. |
| 6,517,341 B1 | 2/2003 | Brun et al. |
| 6,554,564 B1 | 4/2003 | Lord |
| 6,607,165 B1 | 8/2003 | Manteiga et al. |
| 6,684,626 B1 | 2/2004 | Orlando et al. |
| 6,709,492 B1 | 3/2004 | Spadaccini et al. |
| 6,732,502 B2 | 5/2004 | Seda et al. |
| 6,763,652 B2 | 7/2004 | Baughman et al. |
| 6,763,653 B2 | 7/2004 | Orlando et al. |
| 6,814,541 B2 | 11/2004 | Evans et al. |
| 6,883,303 B1 | 4/2005 | Seda |
| 7,021,042 B2 | 4/2006 | Law |
| 7,108,485 B2 | 9/2006 | Wobben |
| 7,185,484 B2 | 3/2007 | Griffin, III et al. |
| 7,219,490 B2 | 5/2007 | Dev |
| 7,328,580 B2 | 2/2008 | Lee et al. |
| 7,374,403 B2 | 5/2008 | Decker et al. |
| 7,526,913 B2 | 5/2009 | Orlando et al. |
| 7,591,754 B2 | 9/2009 | Duong et al. |
| 7,594,388 B2 | 9/2009 | Cherry et al. |
| 7,632,064 B2 | 12/2009 | Somanath et al. |
| 7,662,059 B2 | 2/2010 | McCune |
| 7,694,505 B2 | 4/2010 | Schilling |
| 7,806,651 B2 | 10/2010 | Kennepohl et al. |
| 7,824,305 B2 | 11/2010 | Duong et al. |
| 7,828,682 B2 | 11/2010 | Smook |
| 7,926,260 B2 | 4/2011 | Sheridan et al. |
| 7,966,806 B2 | 6/2011 | Henry et al. |
| 7,976,283 B2 | 7/2011 | Huck |
| 7,984,607 B2 | 7/2011 | Sharma et al. |
| 7,997,868 B1 | 8/2011 | Liang |
| 8,128,021 B2 | 3/2012 | Suciu et al. |
| 8,180,596 B2 | 5/2012 | Henning et al. |
| 8,205,432 B2 | 6/2012 | Sheridan |
| 8,209,952 B2 | 7/2012 | Ress, Jr. |
| 8,246,292 B1 | 8/2012 | Morin et al. |

(56) References Cited

U.S. PATENT DOCUMENTS

| | | |
|---|---|---|
| 8,267,349 B2 | 9/2012 | Suciu et al. |
| 8,632,301 B2 | 1/2014 | Topol et al. |
| 8,714,913 B2 | 5/2014 | Topol et al. |
| 8,834,099 B1 | 9/2014 | Topol et al. |
| 9,140,127 B2 | 9/2015 | Gallagher et al. |
| 9,163,517 B2 | 10/2015 | Gallagher et al. |
| 9,347,323 B2 | 5/2016 | Gallagher et al. |
| 9,624,834 B2 | 4/2017 | Topol et al. |
| 9,726,019 B2 | 8/2017 | Topol et al. |
| 9,733,266 B2 | 8/2017 | Topol et al. |
| 2002/0096598 A1 | 7/2002 | Nelson |
| 2003/0163983 A1 | 9/2003 | Seda et al. |
| 2004/0128978 A1 | 7/2004 | McCune et al. |
| 2004/0255590 A1 | 12/2004 | Rago et al. |
| 2005/0017876 A1 | 1/2005 | Ziarno |
| 2006/0117756 A1 | 6/2006 | Wakeman et al. |
| 2006/0228206 A1 | 10/2006 | Decker et al. |
| 2007/0018034 A1 | 1/2007 | Dickau |
| 2008/0003096 A1 | 1/2008 | Kohli et al. |
| 2008/0022691 A1 | 1/2008 | Kennepohl et al. |
| 2008/0098716 A1 | 5/2008 | Orlando et al. |
| 2008/0098718 A1 | 5/2008 | Henry et al. |
| 2008/0116009 A1 | 5/2008 | Sheridan et al. |
| 2008/0190095 A1 | 8/2008 | Baran |
| 2008/0317588 A1 | 12/2008 | Grabowski et al. |
| 2009/0056343 A1 | 3/2009 | Suciu et al. |
| 2009/0191047 A1 | 7/2009 | Schlinker et al. |
| 2009/0260345 A1 | 10/2009 | Chaudhry |
| 2009/0301055 A1 | 12/2009 | Kallappa |
| 2009/0304518 A1 | 12/2009 | Kodama et al. |
| 2009/0314881 A1 | 12/2009 | Suciu et al. |
| 2010/0105516 A1 | 4/2010 | Sheridan et al. |
| 2010/0148396 A1 | 6/2010 | Xie et al. |
| 2010/0172741 A1 | 7/2010 | Hosoya et al. |
| 2010/0192595 A1 | 8/2010 | Orlando et al. |
| 2010/0212281 A1 | 8/2010 | Sheridan |
| 2010/0218483 A1 | 9/2010 | Smith |
| 2010/0219779 A1 | 9/2010 | Bradbrook |
| 2010/0331139 A1 | 12/2010 | McCune |
| 2011/0056183 A1 | 3/2011 | Sankrithi et al. |
| 2011/0056208 A1 | 3/2011 | Norris et al. |
| 2011/0159797 A1 | 6/2011 | Beltman et al. |
| 2011/0219741 A1 | 9/2011 | Ernst et al. |
| 2011/0265285 A1 | 11/2011 | Morgan |
| 2011/0293423 A1 | 12/2011 | Bunker et al. |
| 2012/0057982 A1 | 3/2012 | O'Hearn et al. |
| 2012/0070278 A1 | 3/2012 | Maguire |
| 2012/0124964 A1 | 5/2012 | Hasel et al. |
| 2012/0171018 A1 | 7/2012 | Hasel et al. |
| 2012/0198816 A1 | 8/2012 | Suciu et al. |
| 2013/0004297 A1 | 1/2013 | Sheridan |
| 2013/0004301 A1 | 1/2013 | Strock et al. |
| 2013/0186058 A1 | 7/2013 | Sheridan et al. |
| 2013/0192196 A1 | 8/2013 | Suciu et al. |
| 2013/0192200 A1 | 8/2013 | Kupratis et al. |
| 2013/0195610 A1 | 8/2013 | Rose et al. |
| 2013/0202403 A1 | 8/2013 | Morin et al. |
| 2013/0223974 A1 | 8/2013 | Schwarz et al. |
| 2013/0223986 A1 | 8/2013 | Kupratis et al. |
| 2013/0224003 A1 | 8/2013 | Kupratis et al. |
| 2013/0255219 A1 | 10/2013 | Schwarz et al. |
| 2013/0259638 A1 | 10/2013 | Suciu et al. |
| 2013/0259639 A1 | 10/2013 | Suciu et al. |
| 2013/0259643 A1 | 10/2013 | Schwarz et al. |
| 2013/0259650 A1 | 10/2013 | Schwarz et al. |
| 2013/0259687 A1 | 10/2013 | Suciu et al. |
| 2013/0276424 A1 | 10/2013 | Topol et al. |
| 2013/0283819 A1 | 10/2013 | Schwarz et al. |
| 2013/0283820 A1 | 10/2013 | Muron et al. |
| 2013/0287545 A1 | 10/2013 | Suciu et al. |
| 2013/0287578 A1 | 10/2013 | Whitehurst et al. |
| 2013/0318998 A1 | 12/2013 | Schwarz et al. |
| 2013/0320185 A1 | 12/2013 | Husband et al. |
| 2014/0003915 A1 | 1/2014 | Topol et al. |
| 2014/0069077 A1 | 3/2014 | Murdock |
| 2014/0155219 A1 | 6/2014 | McCune et al. |
| 2015/0152787 A1 | 6/2015 | Topol et al. |

FOREIGN PATENT DOCUMENTS

| | | |
|---|---|---|
| CN | 1453466 A | 11/2003 |
| CN | 1952373 A | 4/2007 |
| DE | 102010023703 A1 | 12/2011 |
| EP | 0791383 A1 | 8/1997 |
| EP | 1142850 A1 | 10/2001 |
| EP | 2157305 A2 | 2/2010 |
| FR | 2260701 A1 | 9/1975 |
| GB | 1386481 A | 3/1975 |
| GB | 1516041 A | 6/1978 |
| GB | 2041090 A | 9/1980 |
| GB | 2426792 A | 12/2006 |
| JP | H08109834 A | 4/1996 |
| JP | 2003286857 A | 10/2003 |
| JP | 2004526619 A | 9/2004 |
| JP | 2006161809 A | 6/2006 |
| JP | 2007113579 A | 5/2007 |
| JP | 2008115856 A | 5/2008 |
| JP | 2008115858 A | 5/2008 |
| JP | 2008196489 A | 8/2008 |
| JP | 2009002329 A | 1/2009 |
| JP | 2010209916 A | 9/2010 |
| WO | 9718396 A1 | 5/1997 |
| WO | 0019082 A2 | 4/2000 |
| WO | 2007038674 A1 | 4/2007 |
| WO | 2013122713 A2 | 8/2013 |
| WO | 2015048214 A1 | 4/2015 |

OTHER PUBLICATIONS

Datasheet. Genx ™ high bypass turbofan engines. Retreived from: https://www.geaviation.com/sites/default/files/datasheet-genx.pdf.

Davies, D. and Miller, D.C. (1971). A variable pitch fan for an ultra quiet demonstrator engine. 1976 Spring Convention: Seeds for Success in Civil Aircraft Design in the Next Two Decades. pp. 1-18.

Davis, D.G.M. (1973). Variable-pitch fans: Progress in Britain. Flight International. Apr. 19, 1973. pp. 615-7.

De la Rosa Blanco, E., Hall, C.A., and Crichton, D. (2007). Challenges in the Silent Aircraft Engine Design. 45th AIAA Aerospace Sciences Meeting and Exhibit. Jan. 8, 2007. pp. 1-20.

Decision Denying Institution of Inter Partes Review. *General Electric Company*, Petitioner v. *United Technologies Corp*, Patent Owner. IPR2016-00857. U.S. Pat. No. 8,246,292. Entered Sep. 29, 2016. pp. 1-13.

Decision Denying Institution of Inter Partes Review, *General Electric Company*, Petitioner v. *United Technologies Corp*, Patent Owner, IPR2019-00213, U.S. Pat. No. 9,624,827, Entered May 13, 2019, pp. 1-24.

Decision Institution of Inter Partes Review, *General Electric Company*, Petitioner v. *United Technologies Corporation and MTU Aero Engines AG*, Patent Owner, IPR2017-00491, U.S. Pat. No. 8,517,668, Entered Jul. 6, 2017, pp. 1-4.

Decision Revoking European Patent EP2809881 (13749721.0) by the Opposition Division mailed May 14, 2021.

Decker, S. and Clough, R. (2016). GE wins shot at voiding pratt patent in jet-engine clash. Bloomberg Technology. Retrieved from: https://www.bloomberg.com/news/articles/2016-06-30/ge-wins-shot-to-invalidate-pratt-airplane-engine-patent-in-u-s.

Declaration of Dr. Magdy Attia, In re United States Patent Application 8,246,292, Executed Apr. 5, 2016, pp. 1-54.

Declaration of Dr. Magdy Attia, In re U.S. Pat. No. 8,313,280, Executed Oct. 21, 2016, pp. 1-88.

Declaration of Dr. Magdy Attia, In re U.S. Pat. No. 8,517,668, Executed Dec. 8, 2016, pp. 1-81.

Declaration of John Eaton, Ph.D. In re U.S. Pat. No. 8,689,568, Executed Mar. 28, 2016, pp. 1-87.

Declaration of Reza Abhari, In re U.S. Pat. No. 8,448,895, Executed Nov. 28, 2016, pp. 1-81.

(56) References Cited

OTHER PUBLICATIONS

Declaration of Reza Abhari. In re U.S. Pat. No. 8,695,920, claims 1-4, 7-14, 17 and 19, Executed Nov. 29, 2016, pp. 1-102.
Declaration of Reza Abhari. In re U.S. Pat. No. 8,695,920. Executed Nov. 30, 2016, pp. 1-67.
Declaration of Reza Abhari, Ph.D. In re U.S. Pat. No. 8,844,265, Executed Jun. 28, 2016, pp. 1-91.
Defeo, A. and Kulina, M. (1977). Quiet clean short-haul experimental engine (QCSEE) main reduction gears detailed design final report. Prepared for NASA. NASA-CR-134872. Jul. 1977. pp. 1-157.
Denos R., et al., "Geared Fan, Aero-Engine Design: From State-of-the-Art Turbofans Towards Innovative Architectures," Lecture Series, Mar. 3, 2008, pp. 1-26.
Dickey, T.A. and Dobak, E.R. (1972). The evolution and development status of ALF 502 turbofan engine. National Aerospace Engineering and Manufacturing Meeting. San Diego, California. Oct. 2-5, 1972. pp. 1-12.
Dittmar, J.H. and Woodward, R.P. (1992). An evaluation of some alternative approaches for reducing fan tone noise. NASA-TM-105356. Feb. 1992. pp. 1-19.
"Division by Zero", Wikipedia Webpage [//en.wikipedia.org/wiki/Division_by_zero accessed on Dec. 29, 2017], 10 pages.
Drago, R.J. (1974). Heavy-lift helicopter brings up drive ideas. Power Transmission Design. Mar. 1987. pp. 1-15.
Drago, R.J. and Margasahayam, R.N. (1987). Stress analysis of planet gears with integral bearings; 3D finite-element model development and test validation. 1987 MSC NASTRAN World Users Conference. Los Angeles, CA. Mar. 1987. pp. 1-14.
Dudley, D.W., Ed. (1954). Handbook of practical gear design. Lancaster, PA: Technomic Publishing Company, Inc. pp. 3.96-102 and 8.12-18.
Dudley, D.W., Ed. (1962). Gear handbook. New York, NY: McGraw-Hill. pp. 14-17 (TOC, Preface, and Index).
Dudley, D.W., Ed. (1962). Gear handbook. New York, NY: McGraw-Hill. pp. 3.14-18 and 12.7-12.21.
Dudley, D.W., Ed. (1994). Practical gear design. New York, NY: McGraw-Hill. pp. 119-124.
Edkins, D.P., Hirschkron, R., and Lee, R. (1972). TF34 turbofan quiet engine study. Final Report prepared for Nasa. NASA-CR-120914. Jan. 1, 1972. pp. 1-99.
Edwards, T. and Zabarnick, S. (1993). Supercritical fuel deposition mechanisms. Ind. Eng. Chem. Res. vol. 32. 1993. pp. 3117-22.
El-Sayad, A.F. (2008). Aircraft propulsion and gas turbine engines. Boca Raton, FL: CRC Press. pp. 215-9 and 855-60.
Enghardt, L., Moreau, A., Tapken, U., Kennepohl, F. (2009). Radial mode decomposition in the outlet of a LP Turbine—estimation of the relative importance of broadband noise. 15th AIAA/CEAS Aeroacoustics Conference (30th AIAA Aeroacoustics Conference). May 11-13, 2009. pp. 1-17.
"Equal-Loudness Contour", Wikipedia webpage [//en.wikipedia.org/wiki/Equal-loudness_contour accessed on Oct. 3, 2017], 5 pages.
European Office Action for European Patent Application No. 13749721.0 dated Sep. 11, 2015.
European Office Action for European Patent Application No. 13769027.7 dated Jan. 9, 2015.
European Office Action for European Patent Application No. 13769027.7 dated Jun. 19, 2015.
European Search Report for Application No. EP13769027.7, dated Dec. 11, 2014, 3 pages.
European Search Report for Application No. EP15151747.1 dated May 21, 2015.
European Search Report for Application No. EP15163074.6, dated Jul. 23, 2015, 17 pages.
European Search Report for Application No. EP16150538.3, dated May 25, 2016, 9 pages.
European Search Report for Application No. EP16178716.3, dated Dec. 7, 2016, 10 pages.
European Search Report for Application No. EP16195177.7, dated Feb. 6, 2017, 11 pages.
FAA Reference Code and Approach Speeds for Boeing Aircraft, dated Mar. 30, 2016, Retrieved from: www.boeing.com/assets/pdf/commercial/airports/faqs/arcandapproachspeeds.pdf and accessed on Dec. 29, 2017, 4 pages.
Faghri, A. (1995). Heat pipe and science technology. Washington, D.C.: Taylor Francis. pp. 1-60.
Falchetti, F., Quiniou, H., and Verdier, L. (1994). Aerodynamic design and 3D Navier-Stokes analysis of a high specific flow fan. ASME. Presented at the International Gas Turbine and Aeroengine Congress and Exposition. The Hague, Netherlands. Jun. 13-16, 1994. pp. 1-10.
File History for U.S. Appl. No. 12/131,876.
Fisher, K., Berton, J., Guynn, M., Haller B., Thurman, D., and Tong, M. (2012). NASA's turbofan engine concept study for a next-generation single-aisle transport. Presentation to ICAO's noise technology independent expert panel. Jan. 25, 2012. pp. 1-23.
Fledderjohn, K.R. (1983). The TFE731-5: Evolution of a decade of business jet service. SAE Technical Paper Series. Business Aircraft Meeting Exposition. Wichita, Kansas. Apr. 12-15, 1983. pp. 1-12.
Frankenfeld, J.W. and Taylor, W.F. (1980). Deposit fromation from deoxygenated hydrocarbons. 4. Studies in pure compound systems. Ind. Eng. Chem., Prod. Res. Dev., vol. 19(1). 1978. pp. 65-70.
2003 NASA seal/secondary air system workshop. (2003). NASA/CP-2004-212963/VOL1. Sep. 1, 2004. pp. 1-408.
About GasTurb. Retrieved Jun. 26, 2018 from: http://gasturb.de/about-gasturb.html.
Adams, et al., "The World's Hugest Jet Engine Is Wider Than a 737's Fuselage", Apr. 28, 2016, www.wired.com/2016/04/worlds-hugest-jet-engine-wider-737s-fuselage/ accessed on Apr. 28, 2016, 5 pages.
Adamson, A.P. (1975). Quiet Clean Short-Haul Experimental Engine (QCSEE) design rationale. Society of Automotive Engineers. Air Transportation Meeting. Hartford, CT. May 6-8, 1975. pp. 1-9.
Aerospace Information Report. (2008). Advanced ducted propulsor in-flight thrust determination. SAE International AIR5450. Aug. 2008. p. 1-392.
Agarwal, B.D and Broutman, L.J. (1990). Analysis and performance of fiber composites, 2nd Edition. John Wiley Sons, Inc. New York: New York. pp. 1-11, 13-23, 26-33, 50-1, 56-8, 60-1, 64-71, 87-9, 324-9, 436-7.
Agma Standard (1997). Design and selection of components for enclosed gear drives. lexandria, VA: American Gear Manufacturers Association. pp. 1-48.
Agma Standard (1999). Flexible couplings—Mass elastic properties and other characteristics. Alexandria, VA: American Gear Manufacturers Association. pp. 1-46.
Agma Standard (2006). Design manual for enclosed epicyclic gear drives. Alexandria, VA: American Gear Manufacturers Association. pp. 1-104.
Ahmad, F. and Mizramoghadam, A.V. (1999). Single v. two stage high pressure turbine design of modern aero engines. ASME. Prestend at the International Gast Turbine Aeroengine Congress Exhibition. Indianapolis, Indiana. Jun. 7-10, 1999. pp. 1-9.
Amezketa, M., Iriarte, X., Ros, J., and Pintor, J. (2009). Dynamic model of a helical gear pair with backlash and angle-varying mesh stiffness. Multibody Dynamics 2009, ECCOMAS Thematic Conference. 2009. pp. 1-36.
Anderson, N.E., Loewenthal, S.H., and Black, J.D. (1984). An analytical method to predict efficiency of aircraft gearboxes. NASA Technical Memorandum prepared for the Twentieth Joint Propulsion Conference. Cincinnati, OH. Jun. 11-13, 1984. pp. 1-25.
Anderson, R.D. (1985). Advanced Propfan Engine Technology (APET) definition study, single and counter-rotation gearbox/pitch change mechanism design. NASA CR-168115. Jul. 1, 1985. pp. 1-289.
Avco Lycoming Divison. ALF 502L Maintenance Manual. Apr. 1981. pp. 1-118.
Aviadvigatel D-110. Jane's Aero-engines, Aero-engines—Turbofan. Jun. 1, 2010.
Awker, R.W. (1986). Evaluation of propfan propulsion applied to general aviation. NASA CR-175020. Mar. 1, 1986. pp. 1-140.
Baker, R.W. (2000). Membrane technology and applications. New York, NY: McGraw-Hill. pp. 87-153.

(56) References Cited

OTHER PUBLICATIONS

Berton, J.J. and Guynn, M.D. (2012). Multi-objective optimization of a turbofan for an advanced, single-aisle transport. NASA/TM-2012-217428. pp. 1-26.
Bessarabov, D.G., Jacobs, E.P., Sanderson, R.D., and Beckman, I.N. (1996). Use of nonporous polymeric flat-sheet gas-separation membranes in a membrane-liquid contactor: experimental studies. Journal of Membrane Sciences, vol. 113. 1996. pp. 275-84.
Bloomer, H.E. and Loeffler, I.J. (1982). QCSEE over-the-wing engine acoustic data. NASA-TM-82708. May 1, 1982. pp. 1-558.
Bloomer, H.E. and Samanich, N.E. (1982). QCSEE under-the-wing engine acoustic data. NASA-TM-82691. May 1, 1982. pp. 1-28.
Bloomer, H.E. and Samanich, N.E. (1982). QCSEE under-the-wing enging-wing-flap aerodynamic profile characteristics. NASA-TM-82890. Sep. 1, 1982. pp. 1-48.
Bloomer, H.E., Loeffler, I.J., Kreim, W.J., and Coats, J.W. (1981). Comparison of NASA and contractor reslts from aeroacoustic tests of QCSEE OTW engine. NASA Technical Memorandum 81761. Apr. 1, 1981. pp. 1-30.
Bornstein, N. (1993). Oxidation of advanced intermetallic compounds. Journal de Physique IV, 1993, 03 (C9), pp. C9-367-C9-373.
Boyce M.P., "Gas Turbine Engineering Handbook," Gulf Publications, Second Edition, Houston, Texas, 1982, 816 pages.
Brennan, P.J. and Kroliczek, E.J. (1979). Heat pipe design handbook. Prepared for National Aeronautics and Space Administration by B K Engineering, Inc. Jun. 1979. pp. 1-348.
Brines, G.L. (1990). The turbofan of tomorrow. Mechanical Engineering: The Journal of the American Society of Mechanical Engineers, 108(8), 65-67.
Bucknell, R.L. (1973). Influence of fuels and lubricants on turbine engine design and performance, fuel and lubircant analyses. Final Technical Report, Mar. 1971-Mar. 1973. pp. 1-252.
Bunker, R.S. (2005). A review of shaped hole turbine film-cooling technology. Journal of Heat Transfer vol. 127. Apr. 2005. pp. 441-453.
Carney, K., Pereira, M. Revilock, and Matheny, P. (2003). Jet engine fan blade containment using two alternate geometries. 4th European LS-DYNA Users Conference. pp. 1-10.
Chapman J.W., et al., "Control Design for an Advanced Geared Turbofan Engine", AIAA Joint Propulsion Conference 2017, Jul. 10, 2017-Jul. 12, 2017, Atlanta, GA, pp. 1-12.
Cheryan, M. (1998). Ultrafiltration and microfiltration handbook. Lancaster, PA: Tecnomic Publishing Company, Inc. pp. 171-236.
Ciepluch, C. (1977). Quiet clean short-haul experimental engine (QCSEE) under-the-wing (UTW) final design report. Prepared for NASA. NASA-CP-134847. Retreived from: https://ntrs.nasa.gov/archive/nasa/casi.ntrs.nasa.gov/19800075257.pdf.
Clark B.J., et al., "Measured and Predicted Noise of the AVCO-Lycoming YF-102 Turbofan Noise," NASA Technical Memorandum 79069, Cleveland, Ohio, Mar. 14, 1979, pp. 1-18.
Clark, B.J., Mcardle, J.G., and Homyak, L. (1979). Measured and predicted noise of the Avco-Lycoming YF-102 turbofan noise. Technical Paper presented at the Fifth Aeroacoustics Conference. Seattle, WA. Mar. 12-14, 1979. pp. 1-4 and Figures.
Clarke, D.R. and Levi, C.G. (2003). Materials design for the next generation thermal barrier coatings. Annual. Rev. Mater. Res. vol. 33. 2003. pp. 383-417.
Communication from the Board of Appeals in European Application No. 13749721.0 (2809881) by Safran Aircraft Engines dated Mar. 3, 2023. [with English translation].
Coy, Peter. The little gear that could reshape the jet engine: A simple idea's almost 30-year, $10 billion journey to the aircraft mainstream. Bloomberg Business. Oct. 15, 2015. p. 1-4.
Cramoisi, G. Ed. (2012). Death in the Potomac: The crash of Air Florida Flight 90. Air Crash Investigations. Accident Report NTSB/AAR-82-8. p. 45-47.
Crichton, D., de la Rosa Blanco, E., Law, T.R., and Hileman, J.I. (2007). Design and operation for ultra noise take-off. 45th AIAA Aerospace Sciences Meeting and Exhibit. Reno, NV. Jan. 8-11, 2007. pp. 1-18.

Culley, D., Garg, S., Hiller, S.J., Horn, W., Kumar, A., Mathews, H.K., Moustapha, H. et al. (2009). More intelligent gas turbine engines. RTO Technical Report. North Atlantic Treat Organsation (NATO). 2009. pp. 1-178.
Cusick, M. (1981). Avco Lycoming's ALF 502 high bypass fan engine. Society of Automotive Engineers, Inc. Business Aircraft Meeting Exposition. Wichita, Kansas. Apr. 7-10, 1981. pp. 1-9.
Daggett, D.L., Brown, S.T., and Kawai, R.T. (2003). Ultra-efficient engine diameter study. NASA/CR-2003-212309. May 2003. pp. 1-52.
Dalton, III., W.N. (2003). Ultra high bypass ratio low noise engine study. NASA/CR-2003-212523. Nov. 2003. pp. 1-187.
Daly, M. Ed. (2008). Jane's Aero-Engine. Issue Twenty-three. Mar. 2008. p. 707-12.
Daly, M. Ed. (2010). Jane's Aero-Engine. Issue Twenty-seven. Mar. 2010. p. 633-636.
Damerau, J. (2014) What is the mesh stiffness of gears? Screen shot of query submitted by Vahid Dabbagh, answered by Dr. Jochan Damerau, Research General Manager at Bosch Corp., Japan. Retrieved from: https://www.researchgate.net/post/What_is_the_mesh_stiffness_of_gears.
Darrah, S. (1987). Jet fuel deoxygenation. Interim Report for Period Mar. 1987-Jul. 1988. pp. 1-22.
Dassault Falcon 900EX Easy Systems Summary. Retrieved from: http://www.smartcockpit.com/docs/F900EX-Engines.pdf pp. 1-31.
Datasheet. CF6-80C2 high-bypass turbofan engines. Retreived from https://geaviation.com/sites/default/files/datasheet-CF6-80C2.pdf.
Hughes, C. (2002). Aerodynamic performance of scale-model turbofan outlet guide vanes designed for low noise. Prepared for the 40th Aerospace Sciences Meeting and Exhibit. Reno, NV. NASA/TM-2001-211352. Jan. 14-17, 2002. pp. 1-38.
Hughes, C. (2010). Geared turbofan technology. NASA Environmentally Responsible Aviation Project. Green Aviation Summit. NASA Ames Research Center. Sep. 8-9, 2010. pp. 1-8.
International Preliminary Report on Patentability for International Application No. PCT/US2013/020724, dated on Aug. 14, 2014, 5 pages.
International Preliminary Report on Patentability for International Application No. PCT/US2013/022035, dated on Aug. 14, 2014, 7 pages.
International Preliminary Report on Patentability for International Application No. PCT/US2014/057338, dated on Apr. 14, 2016, 12 pages.
International Search Report and Written Opinion for PCT Application No. PCT/US2014/057338 dated on Jan. 6, 2015, 16 pages.
Ivchenko-Progress AI-727M. Jane's Aero-engines, Aero-engines—Turbofan. Nov. 27, 2011.
Ivchenko-Progress D-436. Jane's Aero-engines, Aero-engines—Turbofan. Feb. 8, 2012.
Ivchenko-Progress D-727. Jane's Aero-engines, Aero-engines—Turbofan. Feb. 7, 2007.
Jacobson, N.S. (1993). Corrosion of silicon-based ceramics in combustion environments. J. Am. Ceram. Soc. 76(1). pp. 3-28.
Jeng, Y.-L., Lavernia, E.J. (1994). Processing of molybdenum disilicide. J. of Mat. Sci. vol. 29. 1994. pp. 2557-2571.
Jeschke, P., Kurzke, J., Schaber, R., and Riegler, C. (2004). Preliminary gas turbine design using the multidisciplinary design system MOPEDS. Journal of Engineering for Gas Turbines and Power. vol. 126. Apr. 2004. 258-264.
Johnston, R.P. and Hemsworth, M.C. (1978). Energy efficient engine preliminary design and integration studies. Jun. 1, 1978. pp. 1-28.
Johnston, R.P., Hirschkron, R., Koch, C.C., Neitzel, R.E., and Vinson, P.W. (1978). Energy efficient engine: Preliminary design and integration study—final report. NASA CR-135444. Sep. 1978. pp. 1-401.
Jorgensen, P.J., Wadsworth, M.E., and Cutler, I.B. (1961). Effects of water vapor on oxidation of silicon carbide. J. Am. Ceram. Soc. 44(6). pp. 248-261.
Kahn, H., Tayebi, N., Ballarini, R., Mullen, R.L., Heuer, A.H. (2000). Fracture toughness of polysilicon MEMS devices. Sensors and Actuators vol. 82. 2000. pp. 274-280.

(56) References Cited

OTHER PUBLICATIONS

Kandebo, S.W. (1998). Geared-Turbofan engine design targets cost, complexity. Aviation Week Space Technology, 148(8). p. 34-5.
Kandebo, S.W. (1998). Pratt & Whitney launches geared turbofan engine. Aviation Week & Space Technology, 148(8). p. 32-4.
Kaplan, B., Nicke, E., Voss, C. (2006), Design of a highly efficient low-noise fan for ultra-high bypass engines. Proceedings of GT2006 for ASME Turbo Expo 2006: Power for Land, Sea and Air. Barcelona, SP. May 8-11, 2006. pp. 1-10.
Kasuba, R. and August, R. (1984). Gear mesh stiffness and load sharing in planetary gearing. American Society of Mechanical Engineers, Design Engineering Technical Conference, Cambridge, MA. Oct. 7-10, 1984. pp. 1-6.
Kerrebrock, J.L. (1977). Aircraft engines and gas turbines. Cambridge, MA: The MIT Press. p. 11.
Knip, Jr., G. (1987). Analysis of an advanced technology subsonic turbofan incorporating revolutionary materials. NASA Technical Memorandum. May 1987. pp. 1-23.
Kojima, Y., Usuki, A. Kawasumi, M., Okada, A., Fukushim, Y., Kurauchi, T., and Kamigaito, O. (1992). Mechanical properties of nylon 6-clay hybrid. Journal of Materials Research, 8(5), 1185-1189.
Kollar, L.P. and Springer, G.S. (2003). Mechanics of composite structures. Cambridge, UK: Cambridge University Press. p. 465.
Krantz, T.L. (1990). Experimental and analytical evaluation of efficiency of helicopter planetary stage. NASA Technical Paper. Nov. 1990. pp. 1-19.
Krenkel, W., Naslain, R., and Schneider, H. Eds. (2001). High temperature ceramic matrix composites pp. 224-229. Weinheim, DE: Wiley-VCH Verlag GmbH.
Kurzke J. (1992). Calculation of installation effects within performance computer programs. Advisory Group for Aerospace Research Development Lecture Series No. 183 on Steady and Transient Performance Prediction of Gas Turbine Engines. May 1992. pp. 7.1-19.
Kurzke, J. (2001). GasTurb 9: A program to calculate design and off-design performance of gas turbines. Retrieved from: https://www.scribd.com/document/92384867/GasTurb9Manual.
Kurzke J. (2002). Performance modeling methodology: Efficiency definitions for cooled single and multistage turbines. Proceeding of ASME Turbo Expo, Amsterdam, The Netherlands. Jun. 3-6, 2002. pp. 1-8.
Kurzke, J. (2008). Preliminary Design, Aero-engine design: From state of the art turbofans towards innovative architectures. pp. 1-72.
Kurzke, J. (2009). Fundamental differences between conventional and geared turbofans. Proceedings of ASME Turbo Expo: Power for Land, Sea, and Air. 2009, Orlando, Florida. pp. 145-153.
Kurzke, J. (2012). GasTurb 12: Design and off-design performance of gas turbines. Retrieved from: https://www.scribd.com/document/153900429/GasTurb-12.
Langston, L. and Faghri, A. Heat pipe turbine vane cooling. Prepared for Advanced Turbine Systems Annual Program Review. Morgantown, West Virginia. Oct. 17-19, 1995. pp. 3-9.
Lau, K., Gu, C., and Hui, D. (2005). A critical review on nanotube and nanotube/nanoclay related polymer composite materials. Composites: Part B 37(2006) 425-436.
Leckie, F.A. and Dal Bello, D.J. (2009). Strength and stiffness of engineering systems. Mechanical Engineering Series. Springer. pp. 1-10, 48-51.
Leckie F.A., et al., "Strength and Stiffness of Engineering Systems," Mechanical Engineering Series, Springer, 2009, pp. 1-3.
Lee, K.N. (2000). Current status of environmental barrier coatings for Si-Based ceramics. Surface and Coatings Technology 133-134, 2000. pp. 1-7.
Levintan, R.M. (1975). Q-Fan demonstrator engine. Journal of Aircraft. Vol 12( 8). Aug. 1975. pp. 658-63.
Lewicki, D.G., Black, J.D., Savage, M., and Coy, J.J. (1985). Fatigue life analysis of a turboprop reduction gearbox. NASA Technical Memorandum. Prepared for the Design Technical Conference (ASME). Sep. 11-13, 1985. pp. 1-26.
Liebeck, R.H., Andrastek, D.A., Chau, J., Girvin, R., Lyon, R., Rawdon, B.K., Scott, P.W. et al. (1995). Advanced subsonic airplane design economics studies. NASA CR-195443. Apr. 1995. pp. 1-187.
Litt, J.S. (2018). Sixth NASA Glenn Research Center propulsion control and diagnostics (PCD) workshop. NASA/CP-2018-219891. Apr. 1, 2018. pp. 1-400.
Lord, W.K., Macmartin, D.G., and Tillman, T.G. (2000). Flow control opportunities in gas turbine engines. American Institute of Aeronautics and Astronautics. pp. 1-15.
Lynwander, P. (1983). Gear drive systems: Design and application. New York, New York: Marcel Dekker, Inc. pp. 145, 355-358.
Macisaac, B. and Langston, R. (2011). Gas turbine propulsion systems. Chichester, West Sussex: John Wiley Sons, Ltd. pp. 260-5.
Malzacher, F.J., Gier, J., and Lippl, F. (2006). Aerodesign and testing of an aeromechanically highly loaded LP turbine. Journal of Turbomachinery. vol. 128. Oct. 2006. pp. 643-49.
Mancuso, J.R. and Corcoran, J.P. (2003). What are the differences in high performance flexible couplings for turbomachinery? Proceedings of the Thirty-Second Turbomachinery Symposium. 2003. pp. 189-207.
Manual. Student's Guide to Learning SolidWorks Software. Dassault Systemes—SolidWorks Corporation. pp. 1-156.
Matsumoto, T., Toshiro, U., Kishida, A., Tsutomu, F., Maruyama, I., and Akashi, M. (1996). Novel functional polymers: Poly (dimethylsiloxane)-polyamide multiblock copolymer. VII. Oxygen permeability of aramid- silicone membranes in a gas-membrane-liquid system. Journal of Applied Polymer Science, vol. 64(6). May 9, 1997. pp. 1153-1159.
Mattingly, J.D. (1996). Elements of gas turbine propulsion. New York, New York: McGraw-Hill, Inc. pp. 1-18, 60-62, 223-234, 462-479, 517-520, 757-767, and 862-864.
Garret TFE731 Turbofan Engine (CAT C). Chapter 79: Lubrciation System. TTFE731 Issue 2. 2010. pp. 1-24.
Gates, D. Bombardier flies at higher market. Seattle Times. Jul. 13, 2008. pp. C6.
Gibala, R., Ghosh, A.K., Van Aken, D.C., Srolovitz, D.J., Basu, A., Chang, H., . . . Yang, W. (1992). Mechanical behavior and interface design of MoSi2-based alloys and composites. Materials Science and Engineering, A155, 1992. pp. 147-158.
Glassman, A.J. (1992). Users manual for updated computer code for axial-flow compressor conceptual design. Prepared for NASA. NASA-CR-189171. Jul. 1992. pp. 1-24.
Glassman, A.J. (Ed.) (1972). Turbine design and application, vol. one. NASA SP-290. pp. 1-99.
Gliebe, P.R. and Janardan, B.A. (2003). Ultra-high bypass engine aeroacoustic study. NASA/CR-2003-21252. GE Aircraft Engines, Cincinnati, Ohio. Oct. 2003. pp. 1-103.
Gliebe, P.R., Ho, P.Y., and Mani, R. (1995). UHB engine fan and broadband noise reduction study. NASA CR-198357. Jun. 1995. pp. 1-48.
Grady, J.E., Weir, D.S., Lamoureux, M.C., and Martinez, M.M. (2007). Engine noise research in NASA's quiet aircraft technology project. Papers from the International Symposium on Air Breathing Engines (ISABE). 2007.
Gray, D.E. (1978). Energy efficient engine preliminary design and integration studies. NASA-CP-2036-PT-1. Nov. 1978. pp. 89-110.
Gray, D.E. (1978). Energy efficient engine preliminary design and integration studies. Prepared for NASA. NASA CR-135396. Nov. 1978. pp. 1-366.
Gray, D.E. and Gardner, W.B. (1983). Energy efficient engine program technology benefit/cost study—vol. 2. NASA CR-174766. Oct. 1983. pp. 1-118.
Greitzer, E.M., Bonnefoy, P.A., Delaroseblanco,E., Dorbian, C.S., Drela, M., Hall, D.K., Hansman, R.J., Hileman, J.I., Liebeck, R.H., Levegren, J. (2010). N+3 aircraft concept designs and trade studies, final report. vol. 1. Dec. 1, 2010. NASA/CR-2010-216794/VOL1. pp. 1-187.
Griffiths, B. (2005). Composite fan blade containment case. Modern Machine Shop. Retrieved from: http://www.mmsonline.com/articles/composite-fan-blade-containment-case pp. 1-4.

(56) References Cited

OTHER PUBLICATIONS

Groeneweg J.F., "Fan noise research at NASA," Inst. of Noise Control Engineering, Noise Con 1994, pp. 43-52.
Groweneweg, J.F. (1994). Fan noise research at NASA. NASA-TM-106512. Prepared for the 1994 National Conference on Noise Control Engineering. Fort Lauderdale, FL. May 1-4, 1994. pp. 1-10.
Groweneweg, J.F. (1994). Fan noise research at NASA. Noise-CON 94. Fort Lauderdale, FL. May 1-4, 1994. pp. 1-10.
Gunston, B. (Ed.) (2000). Jane's aero-engines, Issue seven. Coulsdon, Surrey, UK: Jane's Information Group Limited. pp. 510-512.
Guynn, M. D., Berton, J.J., Fisher, K. L., Haller, W.J., Tong, M. T., and Thurman, D.R. (2009). Analysis of turbofan design options for an advanced single-aisle transport aircraft. American Institute of Aeronautics and Astronautics. pp. 1-13.
Guynn, M. D., Berton, J.J., Fisher, K. L., Haller, W.J., Tong, M. T., and Thurman, D.R. (2011). Refined exploration of turbofan design options for an advanced single-aisle transport. NASA/TM-2011-216883. pp. 1-27.
Guynn, M.D., Berton, J.J., Fisher, K.L., Haller, W.J., Tong, M.T., and Thurman, D.R. (2009). Engine concept study for an advanced single-aisle transport. NASA/TM-2009-215784. pp. 1-97.
Haldenbrand, R. and Norgren, W.M. (1979). Airesearch QCGAT program [quiet clean general aviation turbofan engines]. NASA-CR-159758. pp. 1-199.
Hall, C.A. and Crichton, D. (2007). Engine design studies for a silent aircraft. Journal of Turbomachinery, 129, 479-487.
Halliwell, I. (1998). Preliminary engine design: A practical overview. 34th AIAA/ASME/SAE/ASEE Joint Propulsion Conference Exhibit. Cleveland, OH. Jul. 13-15, 1998. pp. 1-7.
Han, J., Dutta, S., and Ekkad, S.V. (2000). Gas turbine heat transfer and cooling technology. New York, NY: Taylor Francis. pp. 1-25, 129-157, and 160-249.
Haque, A. and Shamsuzzoha, M., Hussain, F., and Dean, D. (2003). S20-glass/epoxy polymer nanocomposites: Manufacturing, structures, thermal and mechanical properties. Journal of Composite Materials, 37 (20), 1821-1837.
Hazlett, R.N. (1991). Thermal oxidation stability of aviation turbine fuels. Philadelphia, PA: ASTM. pp. 1-163.
Heidelberg, L.J., and Hall, D.G. (1992). Acoustic mode measurements in the inlet of a model turbofan using a continuously rotating rake. AIAA-93-0598. 31st Aerospace Sciences Meeting. Reno, NV. Jan. 11-14, 1993. pp. 1-30.
Heidelberg, L.J., and Hall, D.G. (1992). Acoustic mode measurements in the inlet of a model turbofan using a continuously rotating rake. NASA-TM-105989. Prepared for the 31st Aerospace Sciences Meeting. Reno, NV. Jan. 11-14, 1993. pp. 1-30.
Heingartner, P., Mba, D., Brown, D. (2003). Determining power losses in the helical gear mesh; Case Study. ASME 2003 Design Engineering Technical Conferences. Chicago, IL. Sep. 2-6, 2003. pp. 1-7.
Hemighaus, G., Boval, T., Bacha, J., Barnes, F., Franklin, M., Gibbs, L., . . . Morris, J. (2007). Aviation fuels: Techincal review. Chevron Products Company. pp. 1-94. Retrieved from: https://www.cgabusinessdesk.com/ document/aviation_tech_review.pdf.
Hendricks, E.S. and Tong, M.T. (2012). Performance and weight estimates for an advanced open rotor engine. NASA/TM-2012-217710. pp. 1-13.
Hess, C. (1998). Pratt Whitney develops geared turbofan. Flug Revue 43(7). Oct. 1998.
Hill, P.G., Peterson, C.R. (1965). Mechanics and thermodynamics of propulsion. Addison-Wesley Publishing Company, Inc. pp. 307-8.
Hill, P.G., Peterson, C.R. (1992). Mechanics and thermodynamics of propulsion, 2nd Edition. Addison-Wesley Publishing Company, Inc. pp. 400-6.
Holcombe, V. (2003). Aero-Propulsion Technology (APT) task V low noise ADP engine definition study. NASA CR-2003-212521. Oct. 1, 2003. pp. 1-73.
Honeywell Learjet 31 and 35/36 TFE731-2 to 2C Engine Upgrade Program. Sep. 2005. pp. 1-4.
Honeywell LF502. Jane's Aero-engines, Aero-engines—Turbofan. Feb. 9, 2012.
Honeywell LF502. Jane's Aero-engines, Aero-engines—Turbofan. Aug. 17, 2016.
Honeywell LF507. Jane's Aero-engines, Aero-engines—Turbofan. Feb. 9, 2012.
Honeywell Sabreliner 65 TFE731-3 to -3D Engine Upgrade Program. Oct. 2005. pp. 1-4.
Honeywell TFE731. Jane's Aero-engines, Aero-engines—Turbofan. Jul. 18, 2012.
Honeywell TFE731 Pilot Tips. pp. 1-143.
Honeywell TFE731-5AR to -5BR Engine Conversion Program. Sep. 2005. pp. 1-4.
Horikoshi, S. and Serpone, N. (2013). Introduction to nanoparticles. Microwaves in nanoparticle synthesis. Wiley-VCH Verlag GmbH & Co. KGaA. pp. 1-24.
Howard, D.F. (1976). QCSEE preliminary under the wing flight propulsion system analysis report. NASA CR-134868. Feb. 1, 1976. pp. 1-260.
Howe, D.C. and Wynosky, T.A. (1985). Energy efficient engine program advanced turbofan nacelle definition study. NASA CR-174942. May 1, 1985. pp. 174.
Howe, D.C., and Wynosky, T.A. (1985). Energy efficient engine program advanced turbofan nacelle definition study. NASA-CR-174942. May 1985. pp. 1-60.
Howe, D.C., and Wynosky, T.A. (1985). Energy efficient engine program advanced turbofan nacelle definition study. NASA-CR-174942. May 1985. University of Washington dated Dec. 13, 1990. pp. 1-14.
Huang, H., Sobel, D.R., and Spadaccini, L.J. (2002). Endothermic heat-sink of hydrocarbon fuels for scramjet cooling. AIAA/ASME/SAE/ASEE, Jul. 2002. pp. 1-7.
Huang, K.S., Liu, Z.G., Li, H., Yang, J., Turner, D.R., Jiang, L., and Wu, Q.H. (2002). Reduction of electromagnetic noise in three-phase induction motors. Proceedings. International Conference on Power System Technology, vol. 2. pp. 745-749.
Mattingly, J.D. (1996). Elements of gas turbine propulsion. New York, New York: McGraw-Hill, Inc. pp. 1-18, 60-62, 85-87, 95-104, 121-123, 223-234, 242-245, 278-285, 303-309, 323-326, 462-479, 517-520, 563-565, 630-632, 668-670, 673-675, 682-685, 697-705, 726-727, 731-732, 802-805, 828-830 and appendices.
Mattingly, J.D. (1996). Elements of gas turbine propulsion. New York, New York: McGraw-Hill, Inc. pp. 1-18, 60-62, 85-87, 95-104, 121-123, 223-234, 242-245, 278-285, 303-309, 323-326, 462-479, 517-520, 563-565, 630-632, 673-675, 682-685, 697-699, 703-705, 802-805, 862-864, and 923-925.
Mattingly, J.D. (1996). Elements of gas turbine propulsion. New York, New York: McGraw-Hill, Inc. pp. 8-15.
Mavris, D.N., Schutte, U.S. (2016). Application of deterministic and probabilistic system design methods and enhancements of conceptual design tools for ERA project final report. NASA/CR-2016-219201. May 1, 2016. pp. 1-240.
Mcardle, J.G. and Moore, A.S. (1979). Static test-stand performance of the YF-102 turobfan engine with several exhaust configurations for the Quiet Short-Haul Research Aircraft (QSRA). Prepared for Nasa. NASA-TP-1556. Nov. 1979. pp. 1-68.
McCracken, R.C. (1979). Quiet short-haul research aircraft familiarization document. NASA-TM-81149. Nov. 1, 1979. pp. 1-76.
McCune, M.E. (1993). Initial test results of 40,000 horsepower fan drive gear system for advanced ducted propulsion systems. AIAA 29th Joint Conference and Exhibit. Jun. 28-30, 1993. pp. 1-10.
McMillian, A. (2008) Material development for fan blade containment casing. Abstract. p. 1. Conference on Engineering and Physics: Synergy for Success 2006. Journal of Physics: Conference Series vol. 105. London, UK. Oct. 5, 2006.
Meier N. (2005) Civil Turbojet/Turbofan Specifications. Retrieved from http://jet-engine.net/civtfspec.html.
Merriam-Webster's collegiate dictionary, 10th Ed. (2001). p. 1125-1126.
Merriam-Webster's collegiate dictionary, 11th Ed. (2009). p. 824.
Meyer, A.G. (1988). Transmission development of TEXTRON Lycoming's geared fan engine. Technical Paper. Oct. 1988. pp. 1-12.

(56) References Cited

OTHER PUBLICATIONS

Middleton, P. (1971). 614: VFW's jet feederliner. Flight International, Nov. 4, 1971. p. 725, 729-732.

Misel, O.W. (1977). QCSEE main reduction gears test program. NASA CR-134669. Mar. 1, 1977. pp. 1-222.

Moxon, J. How to save fuel in tomorrow's engines. Flight International. Jul. 30, 1983. 3873(124). pp. 272-273.

Muhlstein, C.L., Stach, E.A., and Ritchie, R.O. (2002). A reaction-layer mechanism for the delayed failure of micron-scale polycrystalline silicon structural films subjected to high-cycle fatigue loading. Acta Materialia vol. 50. 2002. pp. 3579-3595.

Munt, R. (1981). Aircraft technology assessment: Progress in low emissions engine. Technical Report. May 1981. pp. 1-171.

Nanocor Technical Data for Epoxy Nanocomposites using Nanomer 1.30E Nanoclay. Nnacor, Inc. Oct. 2004.

NASA Conference Publication. (1978). CTOL transport technology. NASA-CP-2036-PT-1. Jun. 1, 1978. pp. 1-531.

NASA Conference Publication. Quiet, powered-lift propulsion. Cleveland, Ohio. Nov. 14-15, 1978. pp. 1-420.

Neitzel, R., Lee, R., and Chamay, A.J. (1973). Engine and installation preliminary design. Jun. 1, 1973. pp. 1-333.

Neitzel, R.E., Hirschkron, R. and Johnston, R.P. (1976). Study of unconventional aircraft engines designed for low energy consumption. NASA-CR-135136. Dec. 1, 1976. pp. 1-153.

Newton, F.C., Liebeck, R.H., Mitchell, G.H., Mooiweer, M.A., Platte, M.M., Toogood, T.L., and Wright, R.A. (1986). Multiple Application Propfan Study (MAPS): Advanced tactical transport. NASA CR-175003. Mar. 1, 1986. pp. 1-101.

Norton, M. and Karczub, D. (2003). Fundamentals of noise and vibration analysis for engineers. Press Syndicate of the University of Cambridge. New York: New York. p. 524.

Notice of Opposition for European Patent No. 2809881 filed Oct. 8, 2018 by Safran Aircraft Engines.

Oates, G.C. (Ed). (1989). Aircraft propulsion systems and technology and design. Washington, D.C.: American Institute of Aeronautics, Inc. pp. 341-344.

Parametric study of STOL short-haul transport engine cycles and operational techniques to minimize community noise impact. NASA-CR-114759. Jun. 1, 1974. pp. 1-397.

Parker, R.G. and Lin, J. (2001). Modeling, modal properties, and mesh stiffness variation instabilities of planetary gears. Prepared for NASA. NASA/CR-2001-210939. May 2001. pp. 1-111.

Partial European Search Report for Application No. EP16178720.5, dated Feb. 13, 2017, 10 pages.

Petition for Inter Partes Review of U.S. Pat. No. 8,246,292, *General Electric Company*, Petitioner v. *United technologies Corporation*, Patent Owner: IPR2016-00857, filed Apr. 8, 2016, 60 pages.

Petition for Inter Partes Review of U.S. Pat. No. 8,517,668. *General Electric Company*, Petitioner, v. *United Technologies Corporation*, Patent Owner. Filed Dec. 14, 2016.

Petrovic, J.J., Castro, R.G., Vaidya, R.U., Peters, M.I., Mendoza, D., Hoover, R.C., and Gallegos, D. E. (2001). Molybdenum disilicide materials for glass melting sensor sheaths. Ceramic Engineering and Science Proceedings. Vol. 22(3). 2001. pp. 59-64.

Philpot, M.G. (1992). Practical consideration in designing the engine cycle. Advisory Group for Aerospace Research Development Lecture Series No. 183 on Steady and Transient Performance Prediction of Gas Turbine Engines. May 1992. pp. 2.1-2.24.

Press release. The GE90 engine. Retreived from: https://www.geaviation.com/commercial/engines/ge90-engine; https://www.geaviation.com/press-release/ge90-engine-family/ge90-115b-fan-completing-blade-testing-schedule-first-engine-test; and https://www.geaviation.com/press-release/ge90-engine-family/ge'scomposite-fan-blade-revolution-turns-20-years-old.

Product Brochure. Garrett TFE731. Allied Signal. Copyright 1987. pp. 1-24.

Pyrograf-III Carbon Nanofiber. Product guide. Retrieved Dec. 1, 2015 from: http://pyrografproducts.com/Merchant5/merchant.mvc?Screen=cp_nanofiber.

QCSEE ball spline pitch-change mechanism whirligig test report. (1978). NASA-CR-135354. Sep. 1, 1978. pp. 1-57.

QCSEE hamilton standard cam/harmonic drive variable pitch fan actuation system derail design report. (1976). NASA-CR-134852. Mar. 1, 1976. pp. 1-172.

QCSEE main reduction gears bearing development program final report. (1975). NASA-CR-134890. Dec. 1, 1975. pp. 1-41.

QCSEE over-the-wing final design report. (1977). NASA-CR-134848. Jun. 1, 1977. pp. 1-460.

QCSEE over-the-wing propulsion system test report vol. III—mechanical performance. (1978). NASA-CR-135325. Feb. 1, 1978. pp. 1-112.

QCSEE Preliminary analyses and design report. vol. 1. (1974). NASA-CR-134838. Oct. 1, 1974. pp. 1-337.

QCSEE preliminary analyses and design report. vol. II. (1974). NASA-CR-134839. Oct. 1, 1974. pp. 340-630.

QCSEE the aerodynamic and mechanical design of the QCSEE under-the-wing fan. (1977). NASA-CR-135009. Mar. 1, 1977. pp. 1-137.

QCSEE the aerodynamic and preliminary mechanical design of the QCSEE OTW fan. (1975). NASA-CR-134841. Feb. 1, 1975. pp. 1-74.

QCSEE under-the-wing engine composite fan blade design. (1975). NASA-CR-134840. May 1, 1975. pp. 1-51.

QCSEE under-the-wing engine composite fan blade final design test report. (1977). NASA-CR-135046. Feb. 1, 1977. pp. 1-55.

QCSEE under-the-wing engine composite fan blade preliminary design test report. (1975). NASA-CR-134846. Sep. 1, 1975. pp. 1-56.

QCSEE under-the-wing engine digital control system design report. (1978). NASA-CR-134920. Jan. 1, 1978. pp. 1-309.

Quiet clean general aviation turbofan (QCGAT) technology study final report vol. I. (1975). NASA-CR-164222. Dec. 1, 1975. pp. 1-186.

Technical Report. (1975). Quiet Clean Short-haul Experimental Engine (QCSEE) UTW fan preliminary design. NASA-CR-134842. Feb. 1, 1975. pp. 1-98.

Technical Report. (1977). Quiet Clean Short-haul Experimental Engine (QCSEE) Under-the-Wing (UTW) final design report. NASA-CR-134847. Jun. 1, 1977. pp. 1-697.

The Aircraft Gas Turbine Engine and Its Operation, United Technologies Corporation, Reprinted with Revisions, Aug. 1988, pp. 3-6 and 3-7.

The Jet Engine, Rolls-Royce plc, 5th Edition, 1996, pp. 19-26.

Third Party Observations for EP Application No. EP13749721.0 (EP2809881) dated Mar. 9, 2015.

Third Party Observations for EP Application No. EP13769027.7 (EP2776678) dated Dec. 3, 2015.

Third Party Observations for European Patent Application No. 13769027.7 (European Patent No. EP 2776678) dated Mar. 9, 2015.

Thulin, R.D., Howe, D.C., and Singer, I.D. (1982). Energy efficient engine: High pressure turbine detailed design report. Prepared for NASA. NASA CR-165608. Recevied Aug. 9, 1984. pp. 1-178.

Tong, M.T., Jones, S.M., Haller, W.J., and Handschuh, R.F. (2009). Engine conceptual design studies for a hybrid wing body aircraft. NASA/TM-2009-215680. Nov. 1, 2009. pp. 1-15.

Trembley, Jr., H.F. (1977). Determination of effects of ambient conditions on aircraft engine emissions. ALF 502 combustor rig testing and engine verification test. Prepared for Environmental Protection Agency. Sep. 1977. pp. 1-256.

Tsirlin, M., Pronin, Y.E., Florina, E.K., Mukhametov, S. Kh., Khatsernov, M.A., Yun, H.M., . . . Kroke, E. (2001). Experimental investigation of multifunctional interphase coatings on SiC fibers for non-oxide high temperature resistant CMCs. High Temperature Ceramic Matrix Composites. 4th Int'l Conf. on High Temp. Ceramic Matrix Composites. Oct. 1-3, 2001. pp. 149-156.

Tummers, B. (2006). DataThief III. Retreived from: https://datathief.org/DatathiefManual.pdf pp. 1-52.

"Turbofan Thrust", NASA Webpage [//www.grc.nasa.gov/www/k-12/airplane/turbfan.html accessed on Dec. 29, 2017], 3 pages.

Turbomeca Aubisque. Jane's Aero-engines, Aero-engines—Turbofan. Nov. 2, 2009.

(56) References Cited

OTHER PUBLICATIONS

Turner, M. G., Norris, A., and Veres, J.P. (2004). High-fidelity three-dimensional simulation of the GE90. NASA/TM-2004-212981. pp. 1-18.
Type Certificate Data Sheet No. E6NE. Department of Transportation Federal Aviation Administration. Jun. 7, 2002. pp. 1-10.
United Technologies Pratt Whitney, "The aircraft gas turbine engine and its operation", Aug. 1988, pp. 5-18 to 5-23.
United Technologies Pratt & Whitney. Aeronautical Vest Pocket Handbook, 22nd Edition. Sep. 1991.
U.S. Department of Transportation: Federal Aviation Administration Advisory Circular, Runway overrun prevention, dated: Nov. 6, 2007, p. 1-8 and Appendix 1 pp. 1-15, Appendix 2 pp. 1-6, Appendix 3 pp. 1-3, and Appendix 4 pp. 1-5.
U.S. Department of Transportation: Federal Aviation Administration Advisory Circular. Standard operating procedures for flight deck crewmembers, Dated: Feb. 27, 2003, p. 1-6 and Appendices.
U.S. Department of Transportation: Federal Aviation Administration Type Certificate Data Sheet No. E6WE. Dated: May 9, 2000. p. 1-9.
U.S. Federal Aviation Administration. Pilot's handbook of aeronautical knowledge. FAA-H-8083-25. Chapter 9: Flight Manuals and Other Documents. 2003. pp. 1-60.
Vasudevan, A.K. and Petrovic, J.J. (1992). A comparative overview of molybedenum disilicide composites. Materials Science and Engineering, A155, 1992. pp. 1-17.
Wall R.A.. (1971). Axial flow compressor performance prediction. Advisory Group for Aerospace Research & Development Lecture Series No. 83 on Modern Prediction for Turbomachine Performance. 1971. pp. 4.1-4.34.
Walsh P.P., et al., "Gas Turbine Performance," First Edition Published by Blackwell Science Ltd, 1998, 2nd Edition, Chapter 5, 2004, pp. 159-177.
Warwick, G. (2007). Civil engines: Pratt & Whitney gears up for the future with GTF. Flight International, Nov. 2007. Retrieved Jun. 14, 2016 from: https://www.flightglobal.com/news/articles/civil-engines-pratt-amp-whitney-gears-up-for-the-future-with-219989/.
Waters, M.H. and Schairer, E.T. (1977). Analysis of turbofan propulsion system weight and dimensions. NASA Technical Memorandum. Jan. 1977. pp. 1-65.
Webster, J.D., Westwood, M.E., Hayes, F.H., Day, R.J., Taylor, R., Duran, A., ... Vogel, W.D. (1998). Oxidation protection coatings for C/SiC based on yttrium silicate. Journal of European Ceramic Society vol. 18. 1998. pp. 2345-2350.
Wendus, B.E., Stark, D.F., Holler, R.P., and Funkhouse, M.E. (2003). Follow-on technology requirement study for advanced subsonic transport. Technical Report prepared for NASA. NASA/CR-2003-212467. Aug. 1, 2003. pp. 1-47.
Whitaker, R. (1982). ALF 502: plugging the turbofan gap. Flight International, p. 237-241, Jan. 30, 1982.
Wie, Y.S., Collier, F.S., Wagner, R.D., Viken, J.K., and Pfenniger, W. (1992). Design of a hybrid laminar flow control engine nacelle. AIAA-92-0400. 30th Aerospace Sciences Meeting & Exhibit. Jan. 6-9, 1992. pp. 1-14.
Wikipedia. Gas Turbine. Retrieved Sep. 18, 2018 from: https://en.wikipedia.org/wiki/Gas_turbine.
Wikipedia. Stiffness. Retrieved Jun. 28, 2018 from: https://en.wikipedia.org/wiki/Stiffness.
Wikipedia. Torsion spring. Retreived Jun. 29, 2018 from: https://en.wikipedia.org/wiki/Torsion_spring.
Wilfert, G. (2008). Geared fan. Aero-Engine Design: From State of the Art Turbofans Towards Innovative Architectures, von Karman Institute for Fluid Dynamics, Belgium, Mar. 3-7, 2008. pp. 1-26. Wilfert G., "Geared Fan," pp. 60-76.
Wilfert, G., Kriegl, B., Scheugenplug, H., Bernard, J., Ruiz, X., and Eury, S. (2005). CLEAN—validation of a high efficient low NOx core, a GTF high speed turbine and an integration of a recuperator in an environmental friendly engine concept. 41st AIAA/ASME/SAE/ASEE Joint Propulsion Conference. Tucson, AZ. Jul. 10-13, 2005. p. 1-11.
Wilfert, G., Kriegl, B., Wald, L., and Johanssen, O. (2005). CLEAN—Validation of a GTF high speed turbine and integration of heat exchanger technology in an environmental friendly engine concept. International Society on Air Breathing Engines. Feb. 2005. pp. 1-8.
Willis, W.S. (1979). Quiet clean short-haul experimental engine (QCSEE) final report. NASA/CR-159473 pp. 1-289.
Winn, A. (Ed). (1990). Wide Chord Fan Club. Flight International, 4217(137). May 23-29, 1990. pp. 34-38.
Witek L. (2006). Failure analysis of turbine disc of an aero engine. Engineering Failure Analysis 13. pp. 9-17.
Wright, G.H. and Russell, J.G. (1990). The M.45SD-02 variable pitch geared fan engine demonstrator test and evaluation experience. Aeronautical Journal., vol. 84(836). Sep. 1980. pp. 268-277.
Xie, M. (2008). Intelligent engine systems: Smart case system. NASA/CR-2008-215233. pp. 1-31.
Xu, Y., Cheng, L., Zhang, L., Ying, H., and Zhou, W. (1999). Oxidation behavior and mechanical properties of C/SiC composites with Si-MoSi2 oxidation protection coating. J. of Mat. Sci. vol. 34. 1999. pp. 6009-6014.
Zalud, T. (1998). Gears put a new spin on turbofan performance. Machine Design, 70(20), p. 104.
Zamboni, G. and Xu, L. (2009). Fan root aerodynamics for large bypass gas turbine engines: Influence on the engine performance and 3D design. Proceedings of ASME Turbo Expo 2009: Power for Land, Sea and Air. Jun. 8-12, 2009, Orlando, Florida, USA. pp. 1-12.
Zhao, J.C. and Westbrook, J.H. (2003). Ultrahigh-temperature materials for jet engines. MRS Bulletin. vol. 28(9). Sep. 2003. pp. 622-630.
Ramsden, J.M. (Ed). (1978). The new European airliner. Flight International, 113(3590). Jan. 7, 1978. pp. 39-43.
Ratna, D. (2009). Handbook of thermoset resins. Shawbury, UK: iSmithers. pp. 187-216.
Rauch, D. (1972). Design study of an air pump and integral lift engine ALF-504 using the Lycoming 502 core. Prepare for NASA. Jul. 1972. pp. 1-182.
Read, B. (2014). Powerplant revolution. AeroSpace. May 2014. pp. 28-31.
Reshotko, M., Karchmer, A., Penko, P.F. and McArdle, J.G. (1977). Core noise measurements on a YF-102 turbofan engine. NASA TM X-73587. Prepared for Aerospace Sciences Meeting sponsored by the American Institute of Aeronautics and Astronautics. Jan. 24-26, 2977.
Respondent's Response in European Patent Application No. 13749721.0 (EP2809881) submitted by Safran Aircraft Engines Jan. 20, 2022. [with English translation].
Reynolds, C.N. (1985). Advanced prop-fan engine technology (APET) single- and counter-rotation gearbox/pitch change mechanism. Prepared for NASA. NASA CR-168114 (vol. I). Jul. 1985. pp. 1-295.
Riegler, C., and Bichlmaier, C. (2007). The geared turbofan technology—Opportunities, challenges and readiness status. Porceedings CEAS. Sep. 10-13, 2007. Berlin, Germany. pp. 1-12.
ROLLS-ROYCE (2005). The jet engine. 5th Edition. Chapter 1.4. 2005. pp. 56-87.
Rolls-Royce M45H. Jane's Aero-engines, Aero-engines—Turbofan. Feb. 24, 2010.
Rotordynamic instability problems in high-performance turbomachinery. (1986). NASA conference publication 2443. Jun. 2-4, 1986.
Roux, E. (2007). Turbofan and turbojet engines database handbook. Editions Elodie Roux. Blagnac: France. pp. 1-595.
Sabnis U.S. (2005). Emissions and noise—Next frontier for aircraft engine technologies. Presented at the AIAA/ AAAF Aircraft Noise and Emissions Reduction Symposium. Monterey, California, USA. May 24-26, 2005.
Salemme, C.T. and Murphy, G.C. (1979). Metal spar/superhybrid shell composite fan blades. Prepared for NASA. NASA-CR-159594. Aug. 1979. pp. 1-127.
Sargisson, D.F. (1985). Advanced propfan engine technology (APET) and single-rotation gearbox/pitch change mechanism. NASA Contractor Report-168113. R83AEB592. Jun. 1, 1985. pp. 1-476.

(56) References Cited

OTHER PUBLICATIONS

Sasada, E. (2010). Kokuki engine no soon teigen gijutsu saizensen. The Journal of Aviation Environment Research. Airport Environment Improvement Foundation. Aviation Environment Research Center. Japan. Mar. 31, 2010, vol. 14, pp. 8-14.
Savelle, S.A. and Garrard, G.D. (1996). Application of transient and dynamic simulations to the U.S. Army T55-L-712 helicopter engine. The American Society of Mechanical Engineers. Presented Jun. 10-13, 1996. pp. 1-8.
Schaefer, J.W., Sagerser, D.R., and Stakolich, E.G. (1977). Dynamics of high-bypass-engine thrust reversal using a variable-pitch fan. Technical Report prepared for NASA. NASA-TM-X-3524. May 1, 1977. pp. 1-33.
Seader, J.D. and Henley, E.J. (1998). Separation process principles. New York, NY: John Wiley Sons, Inc. pp. 722-6 and 764-71.
Shah, D.M. (1992). MoSi2 and other silicides as high temperature structural materials. Superalloys 1992. The Minerals, Metals, Materials Society. pp. 409-422.
Shorter Oxford English Dictionary, 6th Edition. (2007), vol. 2, N-Z, pp. 1888.
Silverstein, C.C., Gottschlich, J.M., and Meininger, M. The feasibility of heat pipe turbine vane cooling. Presented at the International Gas Turbine and Aeroengine Congress and Exposition, The Hague, Netherlands. Jun. 13-16, 1994.pp. 1-7.
Singapore Search Report for Application No. SG11201403706W, dated Sep. 7, 2015, 16 pages.
Singh, A. (2005). Application of a system level model to study the planetary load sharing behavior. Jounal of Mechanical Design. vol. 127. May 2005. pp. 469-76.
Singh, B. (1986). Small engine component technology (SECT) study. NASA CR-175079. Mar. 1, 1986. pp. 1-102.
Singh O.P., et al., "The effect of rubber dampers on engine's NVH and thermal performance", Applied Acoustics, 2013, vol. 75, pp. 17-26.
Singh, R. and Houser, D.R. (1990). Non-linear dynamic analysis of geared systems. NASA-CR-180495. Feb. 1, 1990. pp. 1-263.
Smith, C.E., Hirschkron, R., and Warren, R.E. (1981). Propulsion system study for small transport aircraft technology (STAT). Final report. NASA-CR-165330. May 1, 1981. pp. 1-216.
Smith, S.F. (1965). A simple correlation of turbine efficiency. Journal of the Royal Aeronautical Society. vol. 69. pp. 467-470.
Smith-Boyd, L. and Pike, J. (1986). Expansion of epicyclic gear dynamic analysis program. Prepared for NASA. NASA CR-179563. Aug. 1986. pp. 1-98.
Sowers, H.D. and Coward, W.E. (1978). QCSEE over-the-wing (OTW) engine acuostic design. NASA-CR-135268. Jun. 1, 1978. pp. 1-52.
Spadaccini, L.J., and Huang, H. (2002). On-line fuel deoxygenation for coke suppression. ASME, Jun. 2002. pp. 1-7.
Spadaccini, L.J., Sobel, D.R., and Huang, H. (2001). Deposit formation and mitigation in aircraft fuels. Journal of Eng. for Gas Turbine and Power, vol. 123. Oct. 2001. pp. 741-746.
Stewart, W.L. (1961). A study of axial-flow turbine efficiency characteristics in terms of velocity diagram parameters. ASME. Presented at the Winter Annual Meeting. New York, NY. Nov. 26-Dec. 1, 1961.
Stricker, J.M. (1998). The gas turbine engine conceptual design process: An integrated approach. Presented at the RTO AVT Symposium. Toulouse, France. May 11-15, 1998. pp. 1-9.
Stricker, J.M. and Norden, C.M. (1991). Computerized preliminary design of turbomachinery. Presented at the International Gas Turbine and Aeroengine Congress and Exposition. Orlando, FL. Jun. 3-6, 1991. pp. 1-7.
Sumer, S.K., Say, S.M., Ege, F., and Sabanci, AI. (2006). Noise exposed of the operators of combine harvesters with and without a cab. Applied Ergonomics vol. 37. pp. 749-756.
Summons to Attend Oral Proceedings for European Patent Application No. EP13749721.0 dated Jul. 22, 2019.
Summons to attend oral proceedings in European Patent Application No. 16178720.5 mailed Jul. 11, 2022.
Sundaram, S.K., Hsu, J-Y., Speyer, R.F. (1994). Molten glass corrosion resistance of immersed combustion-heating tube materials in soda-lime-silicate glass. J. Am. Ceram. Soc. 77(6). pp. 1613-23.
Sundaram, S.K., Hsu, J-Y., Speyer, R.F. (1995). Molten glass corrosion resistance of immersed combustion-heating tube materials in e-glass. J. Am. Ceram. Soc. 78(7). pp. 1940-46.
Supplementary European Search Report for Application No. EP13749721.0, dated Jul. 15, 2015, 5 pages.
Sutliff, D. (2005). Rotating rake turbofan duct mode measurement system. NASA TM-2005-213828. Oct. 1, 2005. pp. 1-34.
Suzuki, Y., Morgan, P.E.D., and Niihara, K. (1998). Improvement in mechanical properties of powder-processed MoSi2 by the addition of Sc2O3 and Y2O3. J. Am. Ceram. Soci. 81(12). pp. 3141-49.
Sweetman, B. and Sutton, O. (1998). Pratt Whitney's surprise leap. Interavia Business & Technology, 53.621, p. 25.
Taylor, W.F. (1974). Deposit formation from deoxygenated hydrocarbons. I. General features. Ind. Eng. Chem., Prod. Res. Develop., vol. 13(2). 1974. pp. 133-38.
Taylor, W.F. (1974). Deposit formation from deoxygenated hydrocarbons. II. Effect of trace sulfur compounds. Ind. Eng. Chem., Prod. Res. Dev., vol. 15(1). 1974. pp. 64-8.
Taylor, W.F. and Frankenfeld, J.W. (1978). Deposit fromation from deoxygenated hydrocarbons. 3. Effects of trace nitrogen and oxygen compounds. Ind. Eng. Chem., Prod. Res. Dev., vol. 17(1). 1978. pp. 86-90.
Technical Data. Teflon. WS Hampshire Inc. Retrieved from: http://catalog.wshampshire.com/Asset/psg_teflon_ptfe.pdf.

LOW NOISE TURBINE FOR GEARED TURBOFAN ENGINE

CROSS-REFERENCE TO RELATED APPLICATION

This application is a continuation of U.S. patent application Ser. No. 16/849,204, filed Apr. 15, 2020, which is a continuation of U.S. patent application Ser. No. 15/245,383, filed Aug. 24, 2016, which is a continuation of U.S. patent application Ser. No. 15/007,784, filed Jan. 27, 2016, which is a continuation of U.S. patent application Ser. No. 14/996,544 filed Jan. 15, 2016, which is a continuation-in-part of U.S. patent application Ser. No. 14/795,931, filed Jul. 10, 2015, which is a continuation-in-part of U.S. patent application Ser. No. 14/248,386, filed Apr. 9, 2014, which is a continuation-in-part of International application Ser. No. PCT/US2013/020724 filed Jan. 9, 2013 which claims priority to U.S. Provisional application Ser. No. 61/592,643, filed Jan. 31, 2012. U.S. patent application Ser. No. 14/248,386 further claims priority to U.S. Provisional application Ser. No. 61/884,660 filed Sep. 30, 2013.

BACKGROUND

This application relates to the design of a turbine which can be operated to produce noise to which human hearing is less sensitive.

Gas turbine engines are known, and typically include a fan delivering air into a compressor. The air is compressed in the compressor and delivered downstream into a combustor section where it was mixed with fuel and ignited. Products of this combustion pass downstream over turbine rotors, driving the turbine rotors to rotate.

Typically, there is a high pressure turbine rotor, and a low pressure turbine rotor. Each of the turbine rotors includes a number of rows of turbine blades which rotate with the rotor. Typically interspersed between the rows of turbine blades are vanes.

The low pressure turbine can be a significant noise source, as noise is produced by fluid dynamic interaction between the blade rows and the vane rows. These interactions produce tones at a blade passage frequency of each of the low pressure turbine stages, and their harmonics.

The noise can often be in a frequency range to which humans are very sensitive. To mitigate this problem, in the past, a vane-to-blade ratio of the fan drive turbine has been controlled to be above a certain number. As an example, a vane-to-blade ratio may be selected to be 1.5 or greater, to prevent a fundamental blade passage tone from propagating to the far field. This is known as acoustic "cut-off."

However, acoustically cut-off designs may come at the expense of increased weight and reduced aerodynamic efficiency. Stated another way, if limited to a particular vane to blade ratio, the designer may be restricted from selecting such a ratio based upon other characteristics of the intended engine.

Historically, the low pressure turbine has driven both a low pressure compressor section and a fan section. More recently, a gear reduction has been provided such that the fan and low pressure compressor can be driven at different speeds.

SUMMARY

In a featured embodiment, a method of designing a gas turbine engine comprises the steps of including a fan section with a fan, the fan including at least one fan blade. The fan section is designed to achieve a low fan pressure ratio less than about 1.45, wherein the low fan pressure ratio is measured across a fan blade alone. A turbine section has a first turbine and a second turbine. A gear reduction is included between the fan and the first turbine, and includes an epicycle gear train having a gear reduction ratio of greater than about 2.5:1. The gear reduction is configured to receive an input from the first turbine and to turn the fan at a lower speed than the first turbine in operation. The first turbine is designed to achieve a pressure ratio greater than about 5:1. The first turbine includes an inlet having an inlet pressure, and an outlet that is prior to any exhaust nozzle and having an outlet pressure. The pressure ratio of the first turbine is a ratio of the inlet pressure to the outlet pressure. The first turbine is designed to further include a number of turbine blades in each of a plurality of rows of the first turbine, the first turbine blades operating at least some of the time at a rotational speed, and the number of blades and the rotational speed being such that the following formula holds true for at least one of the blade rows of the first turbine: (number of blades×speed)/60≥5500. The rotational speed is an approach speed in revolutions per minute, taken at an approach certification point as defined in Part 36 of the Federal Airworthiness Regulations. The gas turbine engine is designed to produce 15,000 pounds of thrust or more.

In another embodiment according to the previous embodiment, the formula results in a number greater than 6000.

In another embodiment according to any of the previous embodiments, the formula results in a number less than or equal to about 10000.

In another embodiment according to any of the previous embodiments, the formula results in a number less than 7000.

In another embodiment according to any of the previous embodiments, the formula holds true for a majority of the blade rows of the first turbine.

In another embodiment according to any of the previous embodiments, the formula results in a number greater than 6000.

In another embodiment according to any of the previous embodiments, the formula results in a number less than or equal to about 10000.

In another embodiment according to any of the previous embodiments, the formula results in a number less than 7000.

In another embodiment according to any of the previous embodiments, a mid-turbine frame is arranged between the second turbine and the first turbine.

In another embodiment according to any of the previous embodiments, a compressor section is configured to drive air along core flowpath, and a plurality of bearing systems is configured to support the first turbine and the second turbine. The mid-turbine frame includes airfoils positioned in the core flowpath and is configured to support at least one of the bearing systems.

In another embodiment according to any of the previous embodiments, the second turbine has two stages.

In another embodiment according to any of the previous embodiments, a first compressor is included, and a shaft is configured to be driven by the first turbine. The gear reduction is arranged intermediate the first compressor and the shaft.

In another embodiment according to any of the previous embodiments, the second turbine has two stages.

In another embodiment according to any of the previous embodiments, the engine is designed to achieve a bypass ratio greater than ten (10). The fan is designed to have a low corrected fan tip speed less than about 1150 ft/second, wherein the low corrected fan tip speed is an actual fan tip speed in ft/second at an ambient temperature divided by $[(\text{Tambient} \degree \text{R})/(518.7\degree \text{R})]^{0.5}$.

In another embodiment according to any of the previous embodiments, the fan section is designed for cruise.

In another embodiment according to any of the previous embodiments, the formula holds true for all of the blade rows of the first turbine.

In another embodiment according to any of the previous embodiments, the formula results in a number greater than 6000.

In another embodiment according to any of the previous embodiments, the formula results in a number less than or equal to about 10000.

In another embodiment according to any of the previous embodiments, the formula results in a number less than 7000.

In another embodiment according to any of the previous embodiments, the formula does not hold true for all of the blade rows of the first turbine.

In another featured embodiment, a method of designing a gas turbine engine comprises the steps of including a fan section with a fan, the fan having at least one fan blade. The fan section is designed to achieve a low fan pressure ratio less than about 1.45, wherein the low fan pressure ratio is measured across a fan blade alone. A turbine section has a first turbine and a second turbine. A gear reduction is between the fan and the first turbine and includes an epicycle gear train having a gear reduction ratio of greater than about 2.5:1. The gear reduction is configured to receive an input from the first turbine and to turn the fan at a lower speed than the first turbine in operation. The first turbine is designed to achieve a pressure ratio greater than about 5:1, the first turbine including an inlet having an inlet pressure, and an outlet that is prior to any exhaust nozzle and having an outlet pressure. The pressure ratio of the first turbine is a ratio of the inlet pressure to the outlet pressure. The first turbine is designed to further include a number of turbine blades in each of a plurality of rows of the first turbine, and the turbine blades of the first turbine operating at least some of the time at a rotational speed, and the number of blades and the rotational speed being such that the following formula holds true for at least one of the blade rows of the first turbine: (number of blades×speed)/60≥5500. The gas turbine engine is designed to produce 15,000 pounds of thrust or more.

In another embodiment according to the previous embodiment, the formula results in a number less than 7000.

In another embodiment according to any of the previous embodiments, the formula holds true for a majority of the blade rows of the first turbine.

In another embodiment according to any of the previous embodiments, the formula results in a number less than 7000.

In another embodiment according to any of the previous embodiments, a mid-turbine frame is arranged between the second turbine and the first turbine.

In another embodiment according to any of the previous embodiments, a compressor section is configured to drive air along core flowpath, and a plurality of bearing systems is configured to support the first turbine and the second turbine, wherein the mid-turbine frame includes airfoils positioned in the core flowpath and is configured to support at least one of the bearing systems.

In another embodiment according to any of the previous embodiments, a first compressor is included, and a shaft is configured to be driven by the first turbine. The gear reduction is arranged intermediate the first compressor and the shaft.

In another embodiment according to any of the previous embodiments, the engine is designed to achieve a bypass ratio greater than ten (10), wherein the fan section is designed for cruise, and wherein the fan is designed to achieve a low corrected fan tip speed less than about 1150 ft/second, wherein the low corrected fan tip speed is an actual fan tip speed in ft/second at an ambient temperature divided by $[(\text{Tambient} \degree \text{R})/(518.7\degree \text{R})]^{0.5}$.

In another embodiment according to any of the previous embodiments, the formula holds true for all of the blade rows of the first turbine.

In another featured embodiment, a method of designing a turbine section comprises the steps of including a low pressure turbine designed to achieve a pressure ratio greater than about 5:1. The low pressure turbine includes an inlet having an inlet pressure, and an outlet that is prior to any exhaust nozzle and having an outlet pressure. The pressure ratio of the low pressure turbine is a ratio of the inlet pressure to the outlet pressure. The low pressure turbine is further designed to include a number of turbine blades in each of a plurality of rows of the low pressure turbine, a majority of the turbine blades of the low pressure turbine operating at least some of the time at a rotational speed, and the number of blades and the rotational speed being such that the following formula holds true for at least one of the blade rows of the low pressure turbine: (number of blades×speed)/60≥5500. The rotational speed is an approach speed in revolutions per minute, taken at an approach certification point as defined in Part 36 of the Federal Airworthiness Regulations.

Although the different examples have the specific components shown in the illustrations, embodiments of this disclosure are not limited to those particular combinations. It is possible to use some of the components or features from one of the examples in combination with features or components from another one of the examples.

These and other features disclosed herein can be best understood from the following specification and drawings, the following of which is a brief description.

DETAILED DESCRIPTION

Figure 1:
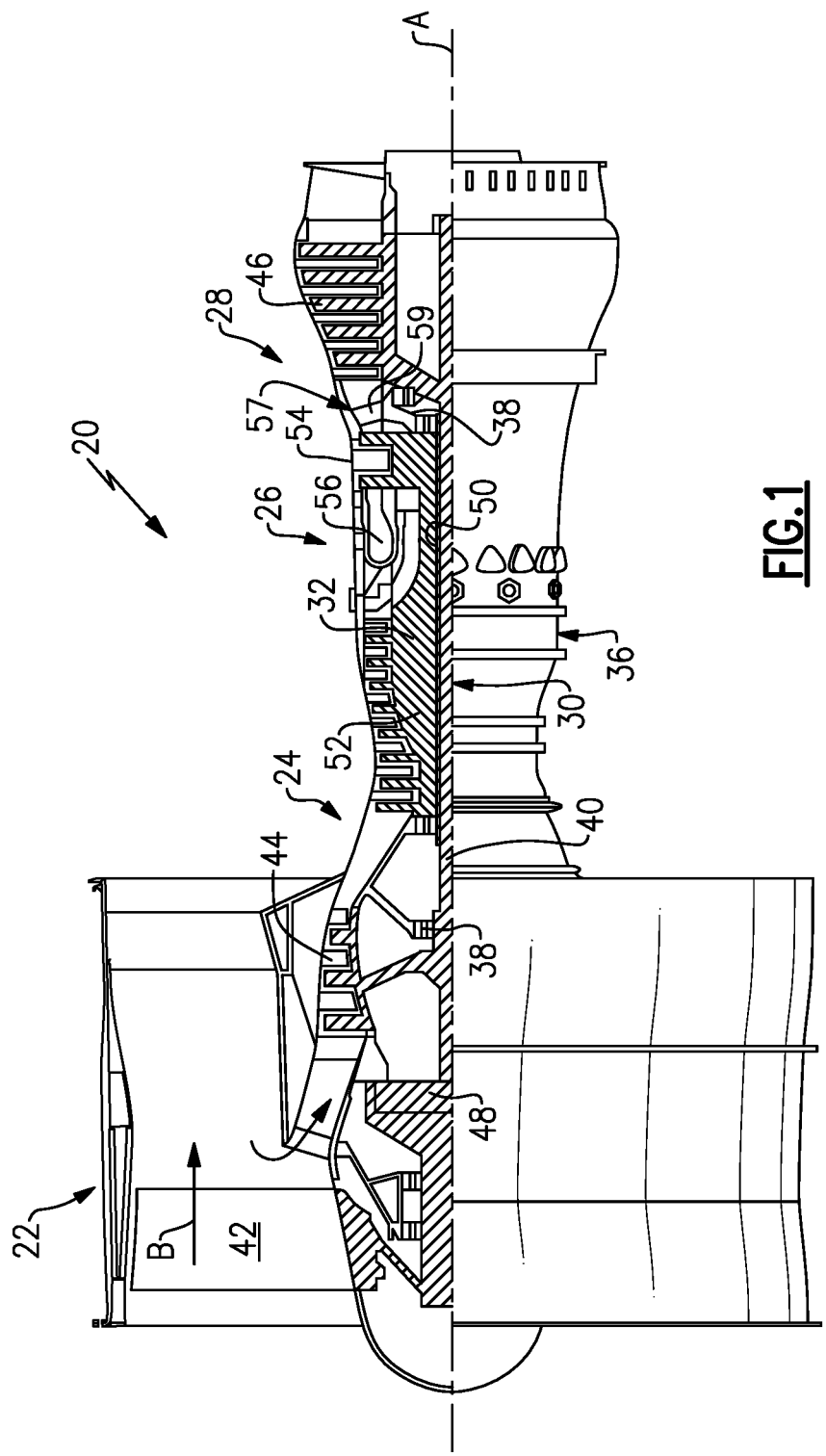
FIG. 1 shows a gas turbine engine.

FIG. 1 schematically illustrates a gas turbine engine 20. The gas turbine engine 20 is disclosed herein as a two-spool turbofan that generally incorporates a fan section 22, a compressor section 24, a combustor section 26 and a turbine section 28. Alternative engines might include an augmentor section (not shown), or an intermediate spool, among other systems or features. The fan section 22 drives air along a bypass flowpath B while the compressor section 24 drives air along a core flowpath C for compression and communication into the combustor section 26 then expansion through the turbine section 28. Although depicted as a two-spool turbofan gas turbine engine in the disclosed non-limiting embodiment, it should be understood that the concepts described herein are not limited to use with two-spool turbofans as the teachings may be applied to other types of turbine engines including three-spool architectures.

The engine 20 generally includes a low speed spool 30 and a high speed spool 32 mounted for rotation about an engine central longitudinal axis A relative to an engine static structure 36 via several bearing systems 38. It should be understood that various bearing systems 38 at various locations may alternatively or additionally be provided.

The low speed spool 30 generally includes an inner shaft 40 that interconnects a fan 42, a low pressure compressor 44 and a low pressure turbine 46. The inner shaft 40 is connected to the fan 42 through a geared architecture 48 to drive the fan 42 at a lower speed than the low speed spool 30. The high speed spool 32 includes an outer shaft 50 that interconnects a high pressure compressor 52 and high pressure turbine 54. A combustor 56 is arranged between the high pressure compressor 52 and the high pressure turbine 54. A mid-turbine frame 57 of the engine static structure 36 is arranged generally between the high pressure turbine 54 and the low pressure turbine 46. The mid-turbine frame 57 further supports bearing systems 38 in the turbine section 28. The inner shaft 40 and the outer shaft 50 are concentric and rotate via bearing systems 38 about the engine central longitudinal axis A which is collinear with their longitudinal axes.

The core airflow is compressed by the low pressure compressor 44 then the high pressure compressor 52, mixed and burned with fuel in the combustor 56, then expanded over the high pressure turbine 54 and low pressure turbine 46. The mid-turbine frame 57 includes airfoils 59 which are in the core airflow path. The turbines 46, 54 rotationally drive the respective low speed spool 30 and high speed spool 32 in response to the expansion.

The terms "low" and "high" as applied to speed or pressure for the spools, compressors and turbines are of course relative to each other. That is, the low speed spool operates at a lower speed than the high speed spool, and the low pressure sections operate at lower pressure than the high pressures sections.

The engine 20 in one example is a high-bypass geared aircraft engine. In a further example, the engine 20 bypass ratio is greater than about six (6), with an example embodiment being greater than ten (10), the geared architecture 48 is an epicyclic gear train, such as a star system, a planetary gear system or other gear system, with a gear reduction ratio of greater than about 2.3:1 or greater than about 2.5:1. In one disclosed embodiment, the engine 20 bypass ratio is greater than about ten (10:1), the fan diameter is significantly larger than that of the low pressure compressor 44, and the low pressure turbine 46 has a pressure ratio that is greater than about 5:1. The low pressure turbine 46 pressure ratio is a ratio of the pressure measured at inlet of low pressure turbine 46 to the pressure at the outlet of the low pressure turbine 46 (prior to an exhaust nozzle). It should be understood, however, that the above parameters are only exemplary of one embodiment of a geared architecture engine and that the present invention is applicable to other gas turbine engines including direct drive turbofans.

A significant amount of thrust is provided by the bypass flow B due to the high bypass ratio. The fan section 22 of the engine 20 is designed for a particular flight condition—typically cruise at about 0.8 Mach and about 35,000 feet. The flight condition of 0.8 Mach and 35,000 ft, with the engine at its best fuel consumption—also known as "bucket cruise Thrust Specific Fuel Consumption ('TSFCT')"—is the industry standard parameter of lbm of fuel being burned divided by lbf of thrust the engine produces at that minimum point. "Low fan pressure ratio" is the pressure ratio across the fan blade alone, without a Fan Exit Guide Vane ("FEGV") system. The low fan pressure ratio as disclosed herein according to one non-limiting embodiment is less than about 1.50 and, in some embodiments, is less than about 1.45. "Low corrected fan tip speed" is the actual fan tip speed in ft/sec divided by an industry standard temperature correction of $[(Tambient\ deg\ R)/518.7)^\wedge 0.5]$. The "Low corrected fan tip speed" as disclosed herein according to one non-limiting embodiment is less than about 1150 ft/second.

The use of the gear reduction between the low pressure turbine spool and the fan allows an increase of speed to the low pressure compressor. In the past, the speed of the low pressure turbine has been somewhat limited in that the fan speed cannot be unduly high. The maximum fan speed is at its outer tip, and in larger engines, the fan diameter is much larger than it may be in lower power engines. However, a gear reduction may be used to free the designer from compromising low pressure turbine speed in order not to have unduly high fan speeds.

It has been discovered that a careful design between the number of rotating blades, and the rotational speed of the low pressure turbine can be selected to result in noise frequencies that are less sensitive to human hearing.

A formula has been developed as follows:

$$(\text{blade count} \times \text{rotational speed})/(60\ \text{seconds/minute}) \geq 4000\ \text{Hz}.$$

That is, the number of rotating blades in any low pressure turbine stage, multiplied by the rotational speed of the low pressure turbine (in revolutions per minute), divided by 60 seconds per minute (to put the amount per second, or Hertz) should be greater than or equal to 4000 Hz. In one embodiment, the amount is above 5500 Hz. And, in another embodiment, the amount is above about 6000 Hz.

The operational speed of the low pressure turbine as utilized in the formula should correspond to the engine operating conditions at each noise certification point currently defined in Part 36 or the Federal Airworthiness Regulations. More particularly, the rotational speed may be taken as an approach certification point as currently defined in Part 36 of the Federal Airworthiness Regulations. For purposes of this application and its claims, the term "approach speed" equates to this certification point.

Although the above formula only needs to apply to one row of blades in the low pressure turbine 26, in one embodiment, all of the rows in the low pressure turbine meet the above formula. In another embodiment, the majority of the blade rows in the low pressure turbine meet the above formula.

This will result in operational noise to which human hearing will be less sensitive.

In embodiments, it may be that the formula can result in a range of greater than or equal to 4000 Hz, and moving higher. Thus, by carefully designing the number of blades and controlling the operational speed of the low pressure turbine (and a worker of ordinary skill in the art would recognize how to control this speed) one can assure that the noise frequencies produced by the low pressure turbine are of less concern to humans.

This invention is most applicable to jet engines rated to produce 15,000 pounds of thrust or more and with bypass ratios greater than about 8.0.

Figure 2:
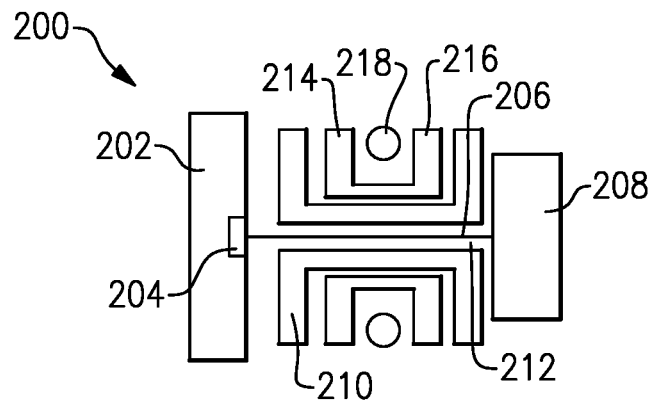
FIG. 2 shows another embodiment.

FIG. 2 shows an embodiment 200, wherein there is a fan drive turbine 208 driving a shaft 206 to in turn drive a fan rotor 202. A gear reduction 204 may be positioned between the fan drive turbine 208 and the fan rotor 202. This gear reduction 204 may be structured and operate like the gear reduction disclosed above. A compressor rotor 210 is driven by an intermediate pressure turbine 212, and a second stage compressor rotor 214 is driven by a turbine rotor 216. A combustion section 218 is positioned intermediate the compressor rotor 214 and the turbine section 216.

Figure 3:
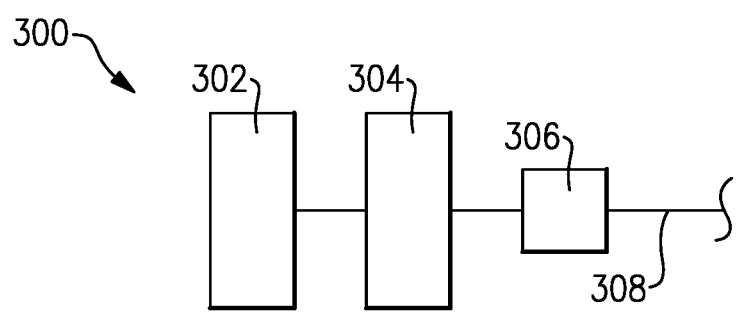
FIG. 3 shows yet another embodiment.

FIG. 3 shows yet another embodiment 300 wherein a fan rotor 302 and a first stage compressor 304 rotate at a common speed. The gear reduction 306 (which may be structured as disclosed above) is intermediate the compressor rotor 304 and a shaft 308 which is driven by a low pressure turbine section.

Although an embodiment of this invention has been disclosed, a worker of ordinary skill in this art would recognize that certain modifications would come within the scope of this invention. For that reason, the following claims should be studied to determine the true scope and content of this invention.

What is claimed is:

1. An aircraft system comprising:
an aircraft; and
a gas turbine engine coupled to the aircraft, wherein the gas turbine engine comprises:
a propulsor section including a propulsor;
a compressor section that drives air from the propulsor along a core flowpath, the compressor section including a first compressor and a second compressor;
a turbine section including a first turbine and a second turbine, wherein the first turbine drives the second compressor, and the second turbine includes a greater number of stages than the first turbine;
a gear reduction between the propulsor and the second turbine, the gear reduction including an epicycle gear train having a gear reduction ratio of greater than 2.5:1, and the gear reduction receiving an input from the second turbine such that the propulsor turns at a lower speed than the second turbine;
wherein the second turbine includes a number of turbine blades in each of a plurality of rows of the second turbine, the second turbine blades operating at least some of the time at a rotational speed, and the number of turbine blades and the rotational speed being such that the following formula holds true for a majority of the plurality of rows of the second turbine: 5500 Hz≤(number of blades×speed)/60 sec≤10000 Hz;
wherein the rotational speed is in revolutions per minute taken at a noise certification point as defined in Part 36 of the Federal Airworthiness Regulations; and
wherein the gas turbine engine is rated to produce 15,000 pounds of thrust or more.

2. The aircraft system as recited in claim 1, wherein:
the first turbine includes two stages; and
the first compressor includes a greater number of stages than the first turbine.

3. The aircraft system as recited in claim 2, wherein:
the formula results in a number less than 7000 Hz for the majority of the plurality of rows of the second turbine.

4. The aircraft system as recited in claim 3, wherein the formula results in a number greater than 6000 Hz for the majority of the plurality of rows of the second turbine.

5. The aircraft system as recited in claim 3, wherein the noise certification point is an approach certification point as defined in Part 36 of the Federal Airworthiness Regulations.

6. The aircraft system as recited in claim 5, wherein the formula does not hold true for all of the plurality of rows of the second turbine.

7. The aircraft system as recited in claim 5, wherein the formula holds true for all of the plurality of rows of the second turbine.

8. The aircraft system as recited in claim 5, wherein:
the first compressor is upstream of the second compressor relative to the core flow path; and
the second turbine includes a greater number of stages than the first compressor.

9. The aircraft system as recited in claim 8, wherein:
the gas turbine engine is a two-spool engine including a low speed spool and a high speed spool;
the low speed spool includes a first shaft that interconnects the propulsor, the first compressor and the second turbine;
the high speed spool includes a second shaft that interconnects the second compressor and the first turbine.

10. The aircraft system as recited in claim 5, wherein the propulsor is a fan including at least one fan blade, and an outer housing surrounds the fan to define a bypass duct.

11. The aircraft system as recited in claim 10, further comprising a bypass ratio of greater than 10, and a low fan pressure ratio less than 1.45 at cruise at 0.8 Mach and 35000 feet, the low fan pressure ratio measured across the at least one fan blade alone.

12. The aircraft system as recited in claim 11, wherein the fan has a low corrected fan tip speed less than 1150 ft/second, wherein the low corrected fan tip speed is an actual fan tip speed in ft/second at an ambient temperature divided by $[(Tambient\ °R)/(518.7°R)]^{0.5}$.

13. The aircraft system as recited in claim 12, wherein the epicycle gear train is a planetary gear system, and further comprising:
a mid-turbine frame arranged between the first turbine and the second turbine;
a plurality of bearing systems that support the first turbine and the second turbine; and
wherein the mid-turbine frame includes airfoils positioned in the core flowpath and supports at least one of the bearing systems.

14. The aircraft system as recited in claim 13, wherein the formula holds true for all of the plurality of rows of the second turbine.

15. A method of operating an aircraft system including an aircraft and a gas turbine engine coupled to the aircraft, the gas turbine engine including a propulsor section including a propulsor, a gear reduction, a compressor section that drives air from the propulsor along a core flowpath, the compressor section including a first compressor and a second compressor, and a turbine section including a first turbine and a second turbine, the method comprising:
driving the propulsor;
driving the first compressor;
driving the second compressor by the first turbine, wherein the second turbine includes a greater number of stages than the first turbine;
driving an input to the gear reduction between the propulsor and the second turbine, the gear reduction including an epicycle gear train having a gear reduction ratio of greater than 2.5:1, and the gear reduction receiving an input from the second turbine such that the propulsor turns at a lower speed than the second turbine;
wherein the second turbine includes a number of turbine blades in each of a plurality of rows of the second turbine; and
wherein the step of driving the input to the gear reduction includes operating the second turbine blades at least some of the time at a rotational speed, the number of turbine blades and the rotational speed being such that the following formula holds true for a majority of the plurality of rows of the second turbine: 5500 Hz≤ (number of blades×speed)/60 sec≤10000 Hz, wherein the rotational speed is in revolutions per minute taken at a noise certification point of the aircraft as defined in Part 36 of the Federal Airworthiness Regulations, and wherein the gas turbine engine is rated to produce 15,000 pounds of thrust or more.

16. The method as recited in claim 15, further comprising: operating the second turbine at a pressure ratio of greater than 5:1, the second turbine including an inlet having an inlet pressure, and an outlet that is prior to any exhaust nozzle and having an outlet pressure, and the pressure ratio of the second turbine being a ratio of the inlet pressure to the outlet pressure.

17. The method as recited in claim 16, wherein the noise certification point is an approach certification point of the aircraft as defined in Part 36 of the Federal Airworthiness Regulations.

18. The method as recited in claim 17, wherein the propulsor is a fan including at least one fan blade, an outer housing surrounds the fan to define a bypass duct, and the step of driving the propulsor occurs such that the fan delivers a portion of airflow to the bypass duct and another portion of airflow to the compressor section to achieve a bypass ratio of greater than 10.

19. The method as recited in claim 18, wherein:

the step of operating the second turbine blades at the rotational speed occurs such that the formula results in a number less than 7000 Hz for the majority of the plurality of rows of the second turbine.

20. The method as recited in claim 19, wherein the step of operating the second turbine blades at the rotational speed occurs such that the formula holds true for all of the plurality of rows of the second turbine.

* * * * *